US008386887B2

(12) United States Patent
Frost et al.

(10) Patent No.: US 8,386,887 B2
(45) Date of Patent: Feb. 26, 2013

(54) HIGH-SPEED MEMORY SYSTEM

(75) Inventors: Holloway H. Frost, Houston, TX (US); Rebecca J. Hutsell, Houston, TX (US)

(73) Assignee: Texas Memory Systems, Inc., Houston, TX (US)

( * ) Notice: Subject to any disclaimer, the term of this patent is extended or adjusted under 35 U.S.C. 154(b) by 0 days.

(21) Appl. No.: 13/244,074

(22) Filed: Sep. 23, 2011

(65) Prior Publication Data

US 2012/0079352 A1 Mar. 29, 2012

Related U.S. Application Data

(60) Provisional application No. 61/386,237, filed on Sep. 24, 2010.

(51) Int. Cl.
*G11C 29/00* (2006.01)
(52) U.S. Cl. ....................................... 714/767
(58) Field of Classification Search ................... 714/767
See application file for complete search history.

(56) References Cited

U.S. PATENT DOCUMENTS

| | | | |
|---|---|---|---|
| 6,148,354 A | 11/2000 | Ban et al. | |
| 6,438,146 B1 | 8/2002 | Brafford | |
| 6,609,167 B1 | 8/2003 | Bastiani et al. | |
| 6,654,831 B1 | 11/2003 | Otterness et al. | |
| 7,000,056 B2* | 2/2006 | Poisner | 710/305 |
| 2003/0088729 A1* | 5/2003 | Polizzi et al. | 711/103 |
| 2004/0255054 A1 | 12/2004 | Pua et al. | |
| 2005/0213421 A1* | 9/2005 | Polizzi et al. | 365/232 |
| 2006/0178052 A1* | 8/2006 | Inaba | 439/630 |
| 2007/0258288 A1* | 11/2007 | Amidon et al. | 365/185.17 |
| 2008/0052600 A1* | 2/2008 | Cheng et al. | 714/763 |
| 2008/0126851 A1 | 5/2008 | Zadigian et al. | |
| 2009/0083457 A1* | 3/2009 | Kim et al. | 710/56 |
| 2009/0172308 A1 | 7/2009 | Prins et al. | |

OTHER PUBLICATIONS

Eckart, B., He, X., Wu, Q., and Xie, C., "A Dynamic Performance-Based Flow Control Method for High-Speed Data Transfer", IEEE Transactions on Parallel and Distributed Systems, vol. 21, No. 1, pp. 114-125, Jan. 2010, copyright 2010 IEEE.
Dell, T., "A White Paper on the Benefits of Chipkill-Correct ECC for PC Server Main Memory", IBM Microelectronics Division—Rev. 19 Nov. 1997, copyright 1997 International Business Machines Corp.
Kim, S.Y., International Search Report for International Patent Application No. PCT/US2011/053129, Korean Intellectual Property Office, dated Apr. 23, 2012.
Kim, S.Y., Written Opinion for International Patent Application No. PCT/US2011/053129, Korean Intellectual Property Office, dated Apr. 23, 2012.

* cited by examiner

*Primary Examiner* — Guy Lamarre
(74) *Attorney, Agent, or Firm* — Locke Lord LLP

(57) ABSTRACT

The disclosed embodiments relate to a Flash-based memory module having high-speed serial communication. The Flash-based memory module comprises, among other things, a plurality of I/O modules, each configured to communicate with an external device over one or more external communication links, a plurality of Flash-based memory cards, each comprising a plurality of Flash memory devices, and a plurality of crossbar switching elements, each being connected to a respective one of the Flash-based memory cards and configured to allow each one of the I/O modules to communicate with the respective one of the Flash-based memory cards. Each I/O module is connected to each crossbar switching element by a high-speed serial communication link, and each crossbar switching element is connected to the respective one of the Flash-based memory cards by a plurality of parallel communication links.

7 Claims, 25 Drawing Sheets

FIG. 17

HIGH-SPEED MEMORY SYSTEM

CROSS REFERENCE TO RELATED APPLICATIONS

This application claims the benefit of priority from U.S. Provisional Application No. 61/386,237, entitled "High-Speed Memory System," filed Sep. 24, 2010, which provisional application is hereby incorporated by reference in its entirety.

STATEMENT REGARDING FEDERALLY SPONSORED RESEARCH

Not applicable.

REFERENCE TO APPENDIX

Not applicable.

BACKGROUND OF THE INVENTION

1. Field of the Invention

This disclosure relates generally to storage systems that are accessed by external host devices and/or external communicating devices.

2. Description of the Related Art

Storage systems often use a variety of methods and devices to receive incoming data and data requests and to process those requests to store or retrieve data. Often such storage systems are limited in their bandwidth because they have a limited number of input/output ports and/or because of bottlenecks that exist within the system. Such bottlenecks can arise through the use of relatively slow data buses, as well as through the use of complicated switching or transmission structures and/or protocols.

Accordingly, what is needed is a more effective, efficient and optimal high-speed memory system.

SUMMARY OF THE INVENTION

The disclosed embodiments relate to methods and apparatuses for providing a more effective, efficient, and optimal high-speed memory system. In general, in one aspect, the disclosed embodiments relate to a Flash-based memory module having high-speed serial communication. The Flash-based memory module comprises, among other things, a plurality of input/output (I/O) modules, each I/O module configured to communicate with an external device over one or more external communication links, a plurality of Flash-based memory cards, each Flash-based memory card comprising a plurality of Flash memory devices, each Flash memory device having a physical memory space that is divided into blocks, each block being further divided into pages, each page representing an individually addressable memory location on which memory operations are performed, multiple such memory locations being erasable at the same time in one-block groupings, and a plurality of crossbar switching elements, each crossbar switching element being connected to a respective one of the Flash-based memory cards and configured to allow each one of the I/O modules to communicate with the respective one of the Flash-based memory cards. Each I/O module is connected to each crossbar switching element by a high-speed serial communication link, each high-speed serial communication link allowing each I/O module to transmit and receive bits representing commands, instructions and/or data to and from each crossbar switching element, and each crossbar switching element is connected to the respective one of the Flash-based memory cards by a plurality of parallel communication links, each parallel communication link connecting one crossbar switching element to one of the Flash memory devices of the respective one of the Flash-based memory cards.

In general, in another aspect, the disclosed embodiments relate to an expandable high-speed memory. The expandable high-speed memory comprises, among other things, a printed circuit board (PCB), interface circuitry mounted on the PCB and configured to allow the high-speed memory card to receive bits representing instructions, commands, and/or data from one or more external devices over one or more high-speed serial communication links, a plurality of memory devices mounted to the PCB, each memory device having a physical memory space on which memory operations are performed, and a controller mounted to the PCB and connected to the interface circuitry and the plurality of memory devices, the controller configured to control communication between the interface circuitry and each memory device to perform the memory operations. The interface circuitry is connected to the controller by a plurality of high-speed serial communication lines, each high-speed serial communication line corresponding to one of the high-speed serial communication links, and the controller is connected to the plurality of memory devices by a predefined number of parallel communication lines, the controller configured to convert the bits representing commands, instructions and/or data from the high-speed serial communication links from a serial format to a parallel format.

In general, in yet another aspect, the disclosed embodiments relate a memory module having high-speed serial communication. The memory module comprises, among other things, a first plurality of input processing blocks and a second plurality of input processing blocks, each input processing blocks configured to receive bits representing commands, instructions and/or data according to a serial format and rearrange the bits representing commands, instructions and/or data according to a parallel format, a plurality of memory devices, each memory device having a physical memory space on which memory operations are performed, and a controller connected to the first and second plurality of input processing blocks and the memory devices, the controller configured to control communication between the first and second plurality of input processing blocks and each memory device to perform the memory operations. The controller comprises, among other things: (a) a first multi-channel buffer and a second multi-channel buffer connected to the first and second plurality of input processing blocks, respectively, each multi-channel buffer configured to receive the bits representing commands, instructions and/or data in parallel format from the first and second plurality of input processing blocks, respectively, and construct a predefined number of words from the bits representing commands, instructions and/or data, each word being composed of a predefined number of bits; (b) a first error correction and data protection circuit and a second error correction and data protection circuit connected to the first and second multi-channel buffers, respectively, the first and second error correction and data protection circuits configured receive the words from the first and second multi-channel buffer, respectively, generate one or more error correction code bits using the words, add the error correction code bits for each word to the word, and output each word with the error correction code bits added thereto; (c) a first output buffer and a second output buffer connected to the first and second correction and data protection circuits, respectively, the first and second output buffers configured to receive in turn the words with the error correction code bits added thereto from the first and second error correction and data protection circuits such that a first word from one of the first and second error correction and data protection circuits is provided to one of the first and second output buffers and a next word from another one of the first and second error correction and data protection circuits is provided to another one of the first and second output buffers; and (d) a memory buffer configured to received the words with the error correction code bits added thereto from the first and second output buffers and to combine a predefined number of the words in a predefined manner to form a super-word.

BRIEF DESCRIPTION OF THE DRAWINGS

FIG. 17 illustrates an exemplary operation of the controller of FIG. 16 over two basic memory cycles in the high-speed storage system of this disclosure.

DETAILED DESCRIPTION

The Figures described above and the written description of specific structures and functions below are not presented to limit the scope of what Applicants have invented or the scope of the appended claims. Rather, the Figures and written description are provided to teach any person skilled in the art to make and use the inventions for which patent protection is sought. Those skilled in the art will appreciate that not all features of a commercial embodiment of the inventions are described or shown for the sake of clarity and understanding. Persons of skill in this art will also appreciate that the development of an actual commercial embodiment incorporating aspects of the present inventions will require numerous implementation-specific decisions to achieve the developer's ultimate goal for the commercial embodiment. Such implementation-specific decisions may include, and likely are not limited to, compliance with system-related, business-related, government-related and other constraints, which may vary by specific implementation, location and from time to time. While a developer's efforts might be complex and time-consuming in an absolute sense, such efforts would be, nevertheless, a routine undertaking for those of skill in this art having benefit of this disclosure. It must be understood that the inventions disclosed and taught herein are susceptible to numerous and various modifications and alternative forms. Lastly, the use of a singular term, such as, but not limited to, "a," is not intended as limiting of the number of items. Also, the use of relational terms, such as, but not limited to, "top," "bottom," "left," "right," "upper," "lower," "down," "up," "side," and the like are used in the written description for clarity in specific reference to the Figures and are not intended to limit the scope of the invention or the appended claims.

Exemplary Storage System

Figure 1:
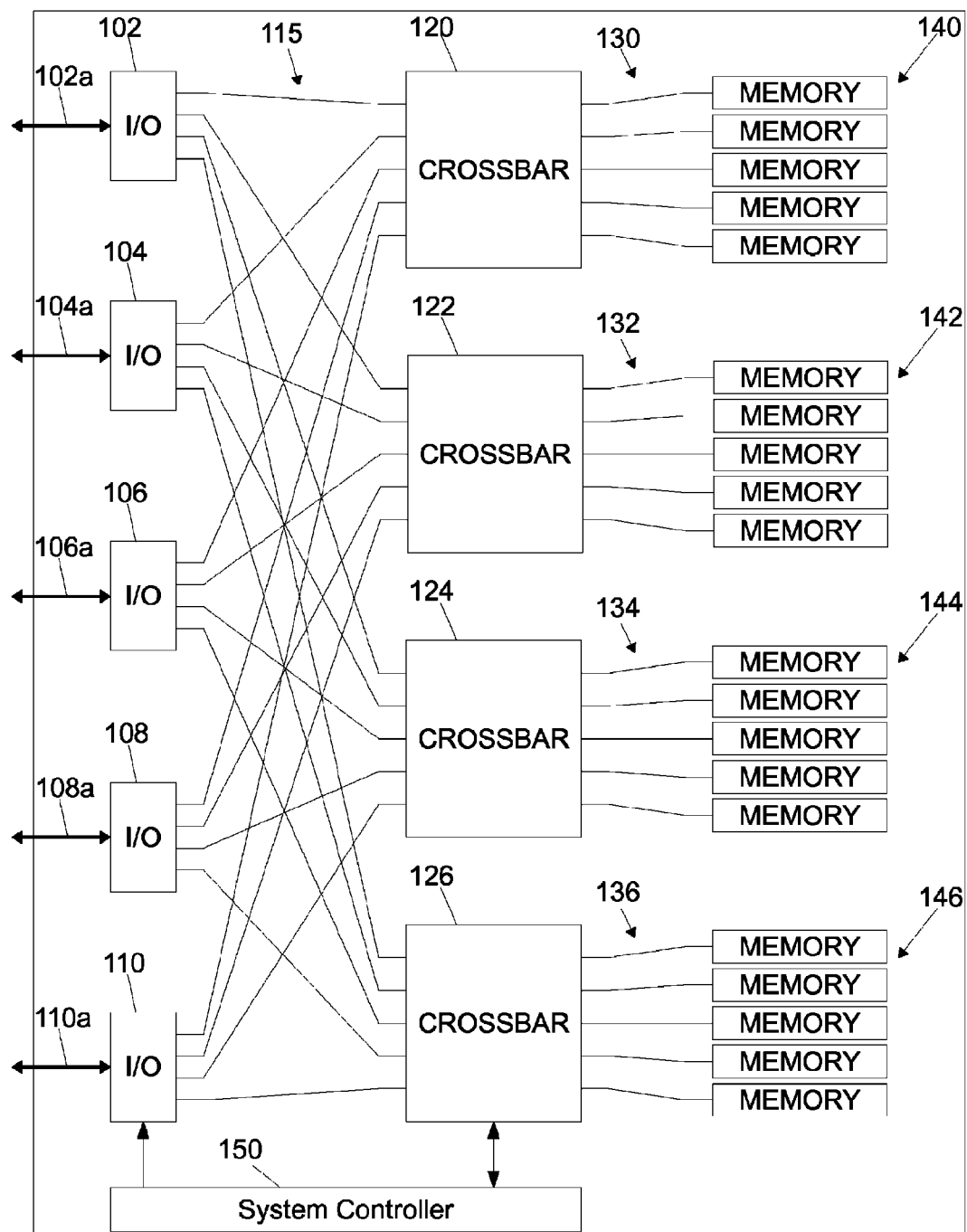
FIG. 1 illustrates a high-speed storage system constructed in accordance with certain teachings of this disclosure.

Turning to the drawings and, in particular, FIG. 1, a high-speed storage system 100 constructed in accordance with certain teachings of this disclosure is illustrated. In general, the high-speed storage system 100 receives data-related requests, such as READ and WRITE requests, from external host devices and processes those requests to store and/or retrieve data to/from physical memory.

The exemplary storage system 100 includes and utilizes a plurality of input/output modules, high-speed serial communication channels, configurable crossbar modules, parallel memory buses, and physical memory cards to provide a connective, high-bandwidth storage system. Additional details of the system and its many novel aspects are provided below.

Referring to FIG. 1, the system 100 includes a plurality of input/output (I/O) interface modules 102, 104, 106, 108 and 110. In the example, five I/O modules are illustrated, although the number of I/O modules is not critical and is subject to change. Each I/O module is coupled to one or more external host devices via a host communication channel (102a, 104a, 106a, 108a and 110a, respectively). The channels 102a, 104a, 106a, 108a and 110a allow external devices—such as servers or any other device that can operate as a host—to provide and/or receive commands, instructions and data to/from the I/O interface modules 102, 104, 106, 108 and 110.

The host communication channels may take various forms and adhere to a variety of protocols including, but not limited to, Fiber Channel, InfiniBand, Ethernet, and Front Panel Data Port (FPDP). The precise physical and logical construction of the communication links is not critical to the disclosed system, although to take full advantage of the benefits provided by the disclosed system, it is preferable that the host communication links be capable of supporting high-bandwidth data transfers.

In the example of FIG. 1, each of the I/O modules 102, 104, 106, 108 and 110 is coupled by a plurality of high-speed serial communication channels (collectively labeled as 115 in FIG. 1) to four configurable crossbar modules 120, 122, 124 and 126. These channels allow the I/O modules to communicate commands, instructions and/or data to the crossbar modules as explained in more detail below.

In the illustrated example, there are four crossbar modules 120, 122, 124 and 126, although it will be appreciated that the number of crossbar modules is not critical and can vary. In FIG. 1, each of the four crossbar modules is coupled to each of the five I/O modules via a distinct serial system communication channel. Alternative embodiments are envisioned in which one or more of the crossbar modules is coupled to fewer than all of the I/O modules.

As reflected in FIG. 1, in the exemplary system, each crossbar module is coupled by a plurality of parallel memory buses to a grouping of memory cards. For example, in the illustrated example, crossbar module 120 is coupled to a first group of memory cards 140 by a first group of parallel memory buses 130. In a similar manner, crossbar modules 122, 124 and 126 are coupled to memory card groups 142, 144 and 146 via parallel memory bus groups 132, 134 and 136, respectively. In the illustrated example, each crossbar module is coupled to a group of five memory cards by five multiplexed parallel buses that may each be used to communicate control, commands, or monitoring information, as well as to transfer data. It will be appreciated that the number of memory cards and the type of memory interface bus can vary without departing from the teachings of this disclosure.

In the illustrated example, each memory card, and therefore each group of memory cards, will generally correspond to a particular range of storage locations. The particular range may be an actual physical address range (e.g., a range of addresses in which each address corresponds to a specific physical storage location associated with the memory card) or a logical address range (e.g., a range of logical addresses in which each logical address can be mapped by a controller on the memory card—or an external controller—to a physical storage location associated with the memory card).

In the example of FIG. 1, the overall system 100 will present a number of available storage addresses to the external hosts, and each memory card will generally correspond to a particular range of the addresses presented by the system 100. In addition, because each group of memory cards is associated with a particular range of addresses, each crossbar is also associated with the range of addresses corresponding to the group of memory cards to which it is connected.

In the system 100 of FIG. 1, a system controller 150 is coupled to each of the I/O modules 102, 104, 106, 108 and 110 and to each of the crossbar modules 120, 122, 124 and 126. Although the system controller connects to all five I/O modules in FIG. 1, only one such connection is illustrated. Likewise, only one of the four connections between the system controller and the crossbar modules is shown. In general, the system controller 150 provides timing and synchronization signals, although it could be used to perform monitoring, reporting and other supervisory tasks.

In general operation, each of the I/O modules receives external data-related requests over its host communication links from an external host device to which the I/O module is connected. Each I/O module processes these data-related requests to enable the storage and/or retrieval of data to/from the storage system 100. In the embodiment of FIG. 1, the data requests are received, and responses are returned, in the form of distinct communication "packets," although alternative communication protocols may be used.

While the precise protocol details depend upon the application, the external protocol should be selected for low communication overhead, promoting a high data throughput. In the system of FIG. 1, the communication packets received and processed by the I/O modules will typically include a header and, if the packet is to transport data, a data payload. While the exact content and format of the header will vary from application to application, the header will typically include: (a) an identifier indicating the type of request (e.g., whether the request is a WRITE request to store data within the system or a READ request to retrieve data previously stored within the system); (b) an identifier indicating a particular ADDRESS associated with the request (e.g., a specific logical or physical "address" that, for a WRITE request, will generally identify a location at which the storage of data associated with the request is to begin, or, for a READ request, a location at which the retrieval of data associated with the request should begin—each of these addresses sometimes referred to as a "TARGET ADDRESS"); and, for some systems, (c) an identification of the source of the data-related request (sometimes referred to as a "SOURCE ADDRESS"); and (d) an identifier indicating the amount of data associated with the request (e.g., an indication of the number of bytes, pages, or other quantity of data, to be stored in or retrieved from the system as part of the request). For some communication protocols, all external data-related requests are presumed to be associated with a specific quantum of data, such as a specifically sized page of data or a specific number of data words. In such protocols, it may not be necessary to specifically designate the amount of data associated with a specific external request, since it will be implicit that the request concerns the standard quantum of data for the particular protocol.

Just as external devices issue data-related requests to their attached I/O modules, the I/O modules also issue requests, termed DMA (direct memory access) requests, or simply DMAs, to their connected crossbar modules and their attached memory cards. Each external request may require access to a range of system addresses spanning multiple memory cards and crossbar modules. Even if a particular external request requires access to only one memory card, the quantity of data associated with the external request may exceed the maximum quantity of data associated with a single DMA request. For this reason, an I/O module may issue more than one DMA request for each external request that it receives. In this scenario, the DMA requests are directed to memory cards in such a manner that data storage or retrieval occurs at the correct physical locations within the system. In the case of an external READ request, for example, the I/O module will issue one or more DMA READ requests in order to "collect" the requested data from the various locations in which it is stored. In the case of an external WRITE request, the I/O module will generally issue one or more DMA WRITE requests in order to "deliver" all of the received data to the various locations at which it should be stored.

In general, DMA WRITE requests are organized into "packets," with the request and its associated data residing within the same packet. DMA READ requests, on the other hand, generally contain only the request information (address, data quantity, et cetera). The responses to each of these request types are roughly complementary. For each DMA WRITE request issued by the I/O module, the crossbar will return a DMA WRITE response packet containing, at a minimum, status information indicating the success or failure of the WRITE operation. For each DMA READ request issued by the I/O module, the crossbar will return a DMA READ response packet containing both the requested data and, at a minimum, status information indicating the validity of the returned data.

In one embodiment in which each of the memory cards within the system utilizes Flash memory, each DMA request specifies the transfer of a fixed quantity of data, with the fixed quantity being equal to the quantity of data stored within a single Flash memory "page." A page, in this example, is generally the smallest amount of information that can be discretely written to the Flash memory.

Figure 1A:
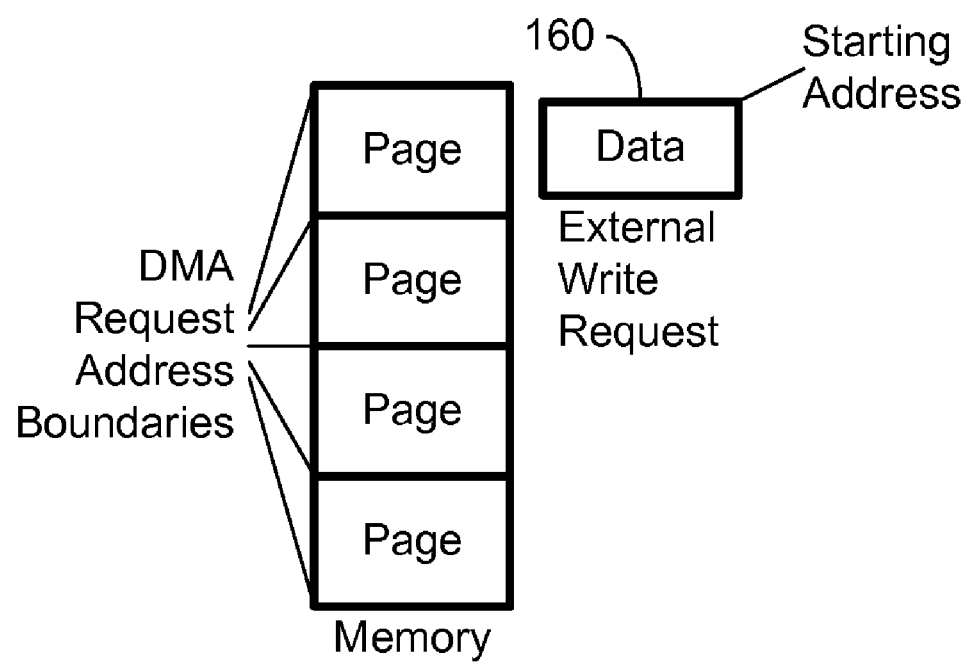
FIGS. 1A-1C illustrate examples of DMA read-modify-write operations that may be performed in the high-speed storage system of this disclosure.
Figure 1B:
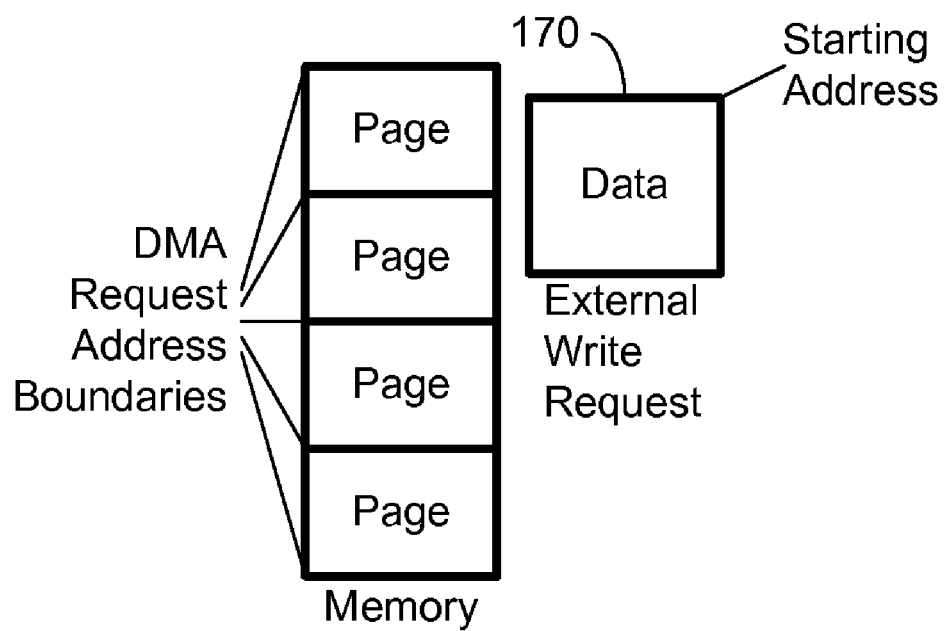
Figure 1C:
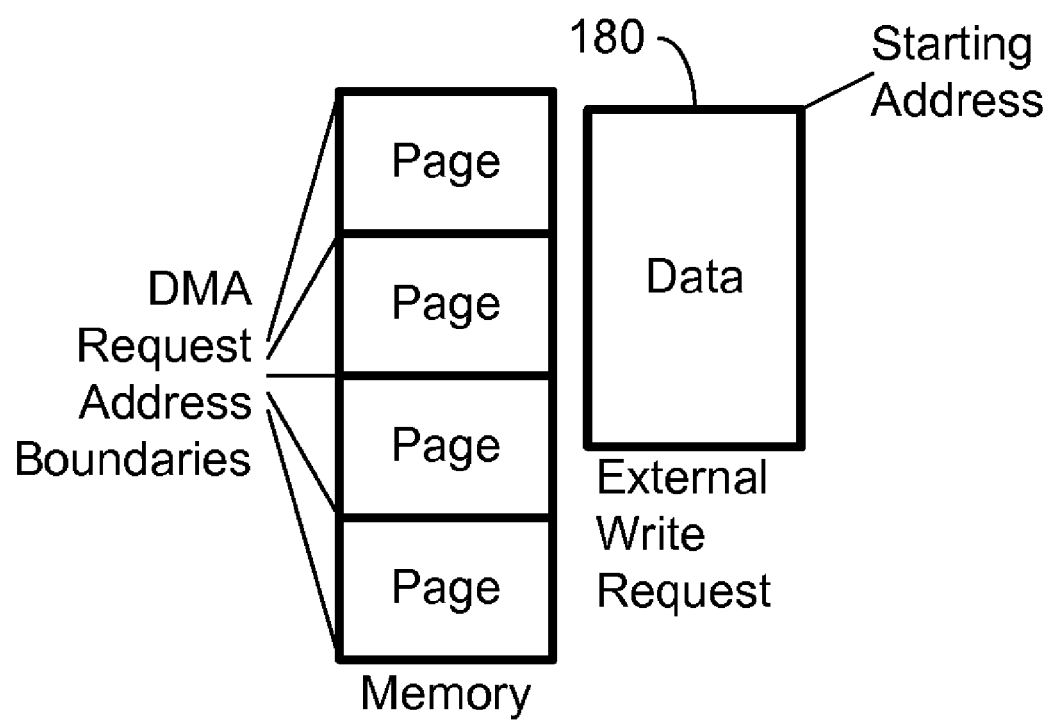

In the system 100 of FIG. 1, DMA requests are generally defined to transfer a fixed quantity of data (4 Kbytes) to and from addresses that are aligned on fixed address boundaries (4 Kbytes). In some cases, it is possible that the range of address spanned by an external WRITE request will not be aligned on these fixed DMA request address boundaries. As shown in FIGS. 1A-1C, an external WRITE request may begin at an address that does not correspond to the allowed starting address of a DMA request. Similarly, a DMA WRITE request may end at an address that does not correspond to the ending address of a DMA request. When this "misalignment" occurs, the I/O card may perform one or more read-modify-write (RMW) operations. In a read-modify-write operation, the I/O module issues a DMA READ request to retrieve data from system memory from an address range that straddles the beginning and/or end of an external WRITE request. The I/O module then modifies (replaces) a portion of this retrieved data with external data from the unaligned WRITE request, and then returns this modified data to system memory by issuing a complementary DMA WRITE request. In this way, the I/O module enables the storage of data into system memory at address ranges that do not adhere to the alignment restrictions of the individual DMA requests.

FIG. 1A shows an example of a "contained within" case, where an external WRITE request specifies an address and quantity of data 160 that is wholly contained within one page, but which will cause a read-modify-write operation to be performed because the starting address is not aligned with a DMA address boundary. In this case, only one DMA READ request is needed. The new (modified) data is overlaid in place of the previously stored data with a DMA WRITE request issued that uses the same (aligned) address as the DMA READ request. FIG. 1B shows an external WRITE request with a specified address and quantity of data 170 that straddles two Flash pages. This "straddle" case will generate two DMA READ requests to retrieve the data and subsequently two DMA WRITE requests to return the new data image. FIG. 1C shows an external WRITE request whose specified address and quantity of data 180 spans across three pages. In this "spanning" case, the I/O card will issue a DMA READ request for the first page, overlay the new data and issue a DMA WRITE request to commit the changes. Since the next page will be completely overwritten by the new data, the I/O card will not need to perform a read-modify-write operation on this page and will simply issues a DMA WRITE request to the aligned address. The remainder of the new data set, however, does not completely fill the third page. Therefore, the I/O card will perform a read-modify-write for this page in the previously described manner. It will be appreciated that these three cases are only a subset of the types of external WRITE request operations that can be performed and are merely intended to illustrate the read-modify-write operation.

While the structure of external requests is generally protocol-dependent, the internal DMA request/response protocol is generally fixed for a particular system and is designed to maximize system performance. In the system of FIG. 1, the DMA requests and DMA responses are structured as packets including a header and, if the packet is to transport data, a data payload.

DMA requests typically include: (a) an identifier indicating the type of DMA request (i.e., whether the DMA request is a WRITE request to store data within the system or a READ request to retrieve data previously stored within the system); (b) an identifier indicating a particular ADDRESS associated with the DMA request (e.g., a specific logical or physical "address" that, for a DMA WRITE request, will generally identify a location at which the storage of data associated with the request is to begin, or, for a DMA READ request, a location at which the retrieval of data associated with the request should begin); (c) an identifier indicating the I/O module from which the DMA request originated; and (d) a "tag" that, for each I/O module, uniquely identifies specific DMA requests originating from that module. For a DMA WRITE request, the request also includes the data to be stored in system memory for that request. In the system 100 of FIG. 1, the quantity of data associated with each DMA request is fixed. For systems in which the quantity of data is variable, the header may also include (e) an identifier indicating the amount of data associated with the request.

DMA responses typically include (a) an identifier indicating the type of DMA response (i.e., whether the response corresponds to a DMA WRITE request or a DMA READ request), (b) a "tag" that, for each I/O module, may be used by the I/O module to uniquely associate each DMA response with its corresponding DMA request, and (c) a status indicator that, for a DMA WRITE response, will indicate the success or failure of the corresponding write operation, or, for a DMA READ request, the validity of the retrieved data. For a DMA READ response, the response also includes the data requested by the original DMA READ request.

In the system 100 of FIG. 1, an I/O module will respond to an external data-related request by, among other things, minimally processing the request to determine whether it is a READ request or a WRITE request and to determine the crossbars (and possibly, the memory boards) to which the corresponding DMA requests must be directed in order to satisfy the external request.

After the external data-related request is minimally processed by the I/O module as provided above, the components of the system will operate to satisfy the request. For example, an I/O module will initially process each external data-related request to identify its type (READ or WRITE), as well as to determine the specific DMA requests that must be issued to satisfy the external request. The I/O module will then deliver the necessary DMA requests to the appropriate crossbar modules for further processing. The crossbar modules, in turn, will (a) determine the memory card to which each received DMA request should be directed, (b) convert each received DMA request from its serial format to a parallel format suitable for presentation to a memory card, and then (c) forward all or part of each DMA request to the memory card whose address range spans the address associated with the DMA request. As described in more detail below, circuitry within the memory card will further process the DMA request to either store provided data in physical memory (for a DMA WRITE request) or retrieve data from physical memory (for a DMA READ request). It is important to note that the data payload associated with each DMA WRITE request is generally delivered as part of the request. In some embodiments, there may be an acknowledgment (ACK) signal between the crossbar modules and the memory cards to confirm that the data has been successfully transmitted to the memory cards.

By using the combination of high-speed serial system communication links for the I/O modules and the crossbar modules, configurable crossbar modules, and high-speed parallel memory communication links for the crossbar modules and the memory cards, the storage system 100 provides an extremely high-bandwidth system.

In the example discussed above, the high-speed serial communication links coupling the I/O interface modules to the crossbar modules are used to carry both command and control information (e.g., information of the type found in the header of a DMA request) and data (e.g., information provided in a data payload). Alternative embodiments are envisioned in which some additional minimal serial communication links are used to provide for communications that do not involve the transfer of data of the type received in a data payload. For example, embodiments are envisioned wherein a relatively low-bandwidth, low-speed serial communication link could be used for specific categories of communication, thereby offloading some amount of traffic from the high-speed links and achieving a corresponding boost in the performance of these links. Each DMA READ request and DMA WRITE response, for example, could be transmitted in this fashion, reserving the high-speed serial links for DMA WRITE requests and DMA READ responses, both of which transport data within their respective packets. Since the DMA READ request and the DMA WRITE response do not transfer any data payload, they are generally much smaller in size and could utilize a slower communication link without a significant performance penalty. In an alternative embodiment, DMA READ requests and DMA WRITE responses may be transferred over an alternative low-bandwidth serial channel or broadcast over a separate shared high-speed link to/from all of the crossbars.

A high-speed serial link could also be used to connect all of the crossbars to all of the I/O modules using a multi-drop bus to provide this sideband data at a signal rate similar to the data. Alternatively, the sideband link could be implemented in a ring structure. In both cases, this would reduce the number of point-to-point connections in the system at the cost of added arbitration logic and hardware, but with the added benefit of higher data throughput and bandwidth.

Additional details concerning the specific elements discussed above, and alternative embodiments of the elements and/or the overall system are provided below.

The I/O Modules

The I/O modules of FIG. 1 may take many forms. One exemplary embodiment of a suitable I/O module is provided in FIG. 2.

Figure 2:
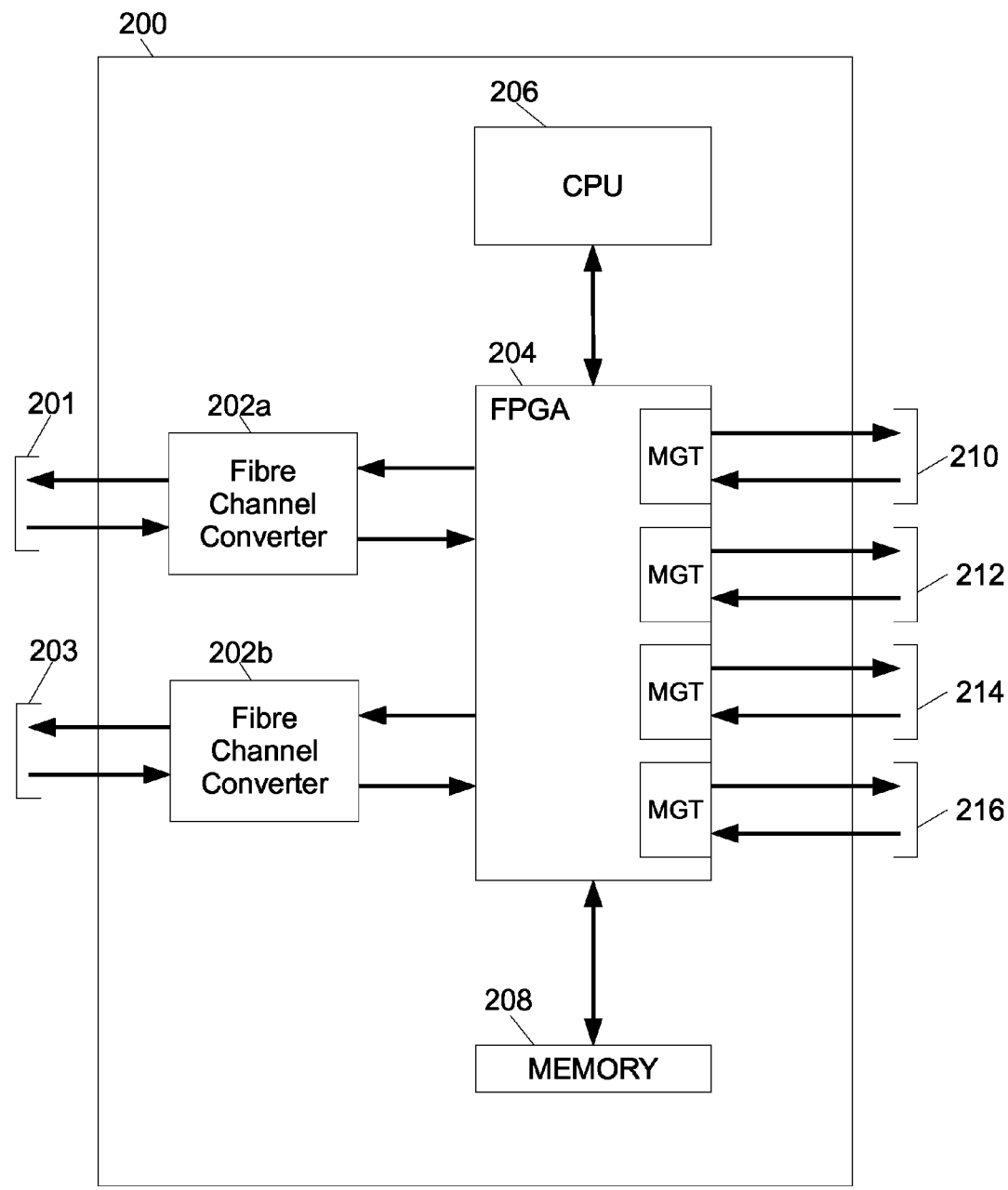
FIG. 2 illustrates an exemplary embodiment of an I/O module that may be used in the high-speed storage system of this disclosure.

Referring to FIG. 2, an exemplary I/O module 200 is illustrated. In this example, the I/O module 200 provides an interface having two separate Fiber Channel ("FC") ports (201 and 203), each allowing the specific I/O module 200 to connect to a Fiber Channel Host Bus Adapter (not illustrated), thereby allowing an external host to access the system 100 as a SCSI device. Each port (201 or 203) includes a single transmit link and a single receive link, with each link operating at either 2.125 gigabits per second (Gb/s) or 4.25 Gb/s. Each port can support Point-to-Point and Arbitrated Loop Fiber Channel protocols. It will be appreciated that this physical interface, and the SCSI and Fiber Channel (FC) protocols, are exemplary and that other physical interfaces and protocols can be used.

Referring to FIG. 2, the exemplary I/O module 200 includes optical to electrical converters 202*a* and 202*b* for converting information between optical and electrical formats. In general, each of these devices (202*a* and 202*b*) converts optical signals received on its external optical receive links (201 or 203) into electrical signals that are then forwarded to a high-speed controller 204. Likewise, each of these devices converts electrical signals received from the high-speed controller 204 into optical signals that are transmitted across its external optical transmit links. Known optical to electrical converters can be used.

The optical to electrical converters, as alluded to above, are coupled to a high-speed controller 204. In the example of FIG. 2, the high-speed controller 204 is a configured field programmable gate array (FPGA), for example a Xilinx Virtex-4 FPGA device. The controller 204 is coupled by a communication link to a programmable microprocessor (CPU) 206, such as a Freescale MPC8547 processor 206, and to memory 208. In the illustrated example, memory 208 is formed from DDR memory components.

As can be seen, the controller 204 provides four high-speed serial system communication channels 210, 212, 214 and 216. The processor 206 and the controller 204 together implement the protocol conversion function between the external Fiber Channel ports (201 and 203) and the four serial system communication channels 210, 212, 214 and 216. In the illustrated example, each of the serial system communication channels comprises a full-duplex physical layer, including both a transmit (TX) sub-channel and a receive (RX) sub-channel. Each sub-channel further comprises two distinct 5 Gb/s serial communication links that are bonded together to form a single sub-channel capable of 10 Gb/s data transfer speeds. In this example, data is 8 B/10 B encoded before it is transmitted over the serial system communication channels, resulting in a data transfer rate of 8 Gb/sec (or 1 GByte per second (GB/sec)). Alternative encoding schemes (e.g., 64 B/66 B encoding) could also be utilized. In the example of FIG. 2, each serial communication channel is implemented using a multi-gigabit transceiver (MGT) module available within a Xilinx Virtex-4 FPGA device, although it is appreciated that other similar methods of implementation could be employed without departing from the teachings of this disclosure. Available procedures for bonding communication links, such as those enabled by the Xilinx Virtex-4 family of FPGA devices, may be used to form the communication channels. Alternatively, other bonding schemes associated with other serialization/deserialization (SerDes) protocols may be utilized.

In the example of FIG. 2, the I/O interface module 200 provides for four serial system communication channels 210, 212, 214 and 216, each connected to a different crossbar module. The use of the four full-duplex serial system communication channels collectively provides a potential 4 GB/sec read bandwidth and 4 GB/sec write bandwidth for each I/O module. Given that the system 100 of FIG. 1 utilizes five I/O modules, the exemplary illustrated system would have an overall read bandwidth of 20 GB/sec and an overall write bandwidth of 20 GB/sec.

In general, the high-speed controller 204 receives and processes external data-related requests received over the FC interfaces 201 and 203. As described above, each external data-related request will typically include a header, indicating: (a) whether the request is a READ or a WRITE request and (b) the TARGET ADDRESS. The header may optionally indicate (c) the SOURCE ADDRESS, as well as (d) an indication of the quantity of data associated with the request. For WRITE requests, the requests will also include a data payload. The high-speed controller 204 will process the request and may provide much of the header information (but not any data payload) to the processor or CPU 206. The CPU 206 will manage at least some portion of the FC protocol and assist in the management of the overall system interface.

As discussed previously, the high-speed controller 204 and CPU 206 work together to manage the external Fiber Channel links. Aside from some minimal CPU assistance, the high-speed controller 204 in most embodiments is solely responsible for issuing the internal DMA requests that are required to satisfy each of the external data-related requests. In particular, the high-speed controller 204 determines the particular DMA requests that must be issued, and to which crossbars the DMA requests must be issued, in order to satisfy each external request. Once the high-speed controller identifies the appropriate crossbar modules and DMA requests required to satisfy an external request, it begins issuing DMA requests to the appropriate crossbars. In general, the number of outstanding DMA requests (those requests for which a response has not yet been received) that may be issued by an I/O module 200 is limited by the size of the tag field in the DMA header. For relatively small transfers, the number of required DMA requests will be small and the high-speed controller 204 can issue all of them without waiting for the receipt of any responses. For large transfers, the number of required DMA requests may be large, and the high-speed controller 204 may be forced to delay the issuance of DMA requests. Given an 8-bit tag value, for example, the high-speed controller could initially issue 256 DMA requests without reusing any tag values. Each outstanding DMA request would be tagged uniquely, enabling the high-speed controller to associate each DMA response with its corresponding DMA request. As responses to the DMA requests are returned, the high-speed controller could begin to reuse tags from completed DMA requests (those for which a DMA response has been received), thereby enabling the issuance of subsequent DMA requests.

In general, DMA requests and their corresponding DMA responses are transferred over the serial system communication channels 210, 212, 214, and 216. Because each I/O module provides for four serial communication channels, it can independently transmit and/or receive data to/from four different crossbar modules simultaneously or nearly simultaneously.

As described earlier, the high-speed controller 204 is responsible for delivering READ and WRITE DMA requests to the correct crossbar modules in order to satisfy each external data-related request. In one embodiment, the high-speed controller 204 determines which crossbar module should receive each DMA request through the use of a lookup table maintained in the high-speed controller memory 208. In this embodiment, the controller 204 will access and maintain a look-up table that will include information that correlates a specific range of addresses within the total range of addresses presented by the system with a specific crossbar module. One benefit of this approach is that it provides a degree of flexibility in the configuration and re-configuration of the system. In yet a further embodiment, the look-up table within memory 208 will further associate a specific range of presented addresses with a given memory card, and the various memory cards with the crossbar modules, such that a received address will correlate to a given crossbar module and to a specific memory card coupled to that given crossbar module.

In an alternative embodiment, the relationship between a given crossbar and a received address is "hardwired" such that a given address range will always correspond to a specific crossbar module.

In yet another embodiment, the relationship between a given crossbar and a received address is dynamic, thereby enabling a failing or otherwise unusable memory card or crossbar to be "remapped" to another memory card or crossbar.

DMA transfers issued by an I/O module, such as I/O interface module 200 of FIG. 2, may specify the transfer of either a fixed or variable quantity of data. For embodiments in which the DMA transfer size is fixed, it may not be necessary for the DMA requests to provide information concerning the quantity of data to be transferred. In the embodiment in which the memory cards use Flash memory, the DMA transfer size is fixed to be the amount of data stored within a single Flash memory page.

A DMA operation may transfer variable amounts of data. In such embodiments, each DMA request will typically include an indication of the amount of data to be transferred (often in terms of multiples of a minimal quantum of data).

During DMA WRITE operations, regardless of whether DMA transfers are performed using a fixed or a variable transfer size, the high-speed controller 204 will queue the data that it receives from an attached external host device. For larger data transfers, consisting of multiple DMA WRITE requests, the I/O interface is not required to wait for the receipt of all external data before beginning to issue DMA WRITE requests. Instead, the high-speed controller may begin to issue DMA WRITE requests, and continue to issue DMA WRITE requests, as soon as enough data is available to support each DMA WRITE request.

During DMA READ operations, the high-speed controller will queue data flowing in the opposite direction (out of system memory). In this case, the high-speed controller will issue a number of DMA READ requests and then wait for DMA READ responses to be returned from the individual crossbar modules. Because these responses may be received in a different order from their corresponding DMA READ requests, the high-speed controller must queue the data received from the crossbars until the data may be delivered in its correct order. Given a scenario in which an external data request requires the issuance of 256 DMA READ requests, it is possible that the last DMA READ response will correspond to the first DMA READ request, thereby requiring the I/O interface to queue the data from 256 DMA transfers. The I/O interface may unload data to the external requester (host device) only as long as the data can be delivered sequentially.

In the manner described above, the I/O interface module 200 can receive data-related requests from an external host, access memory within the system 100 to fulfill the request, and provide requested data externally to host devices.

It should be appreciated that the I/O interface module of FIG. 2 is but one example of an I/O interface module that can be used in the system of the present disclosure. Alternative I/O interfaces can be used. One example of an alternative interface is provided in FIG. 3.

Figure 3:
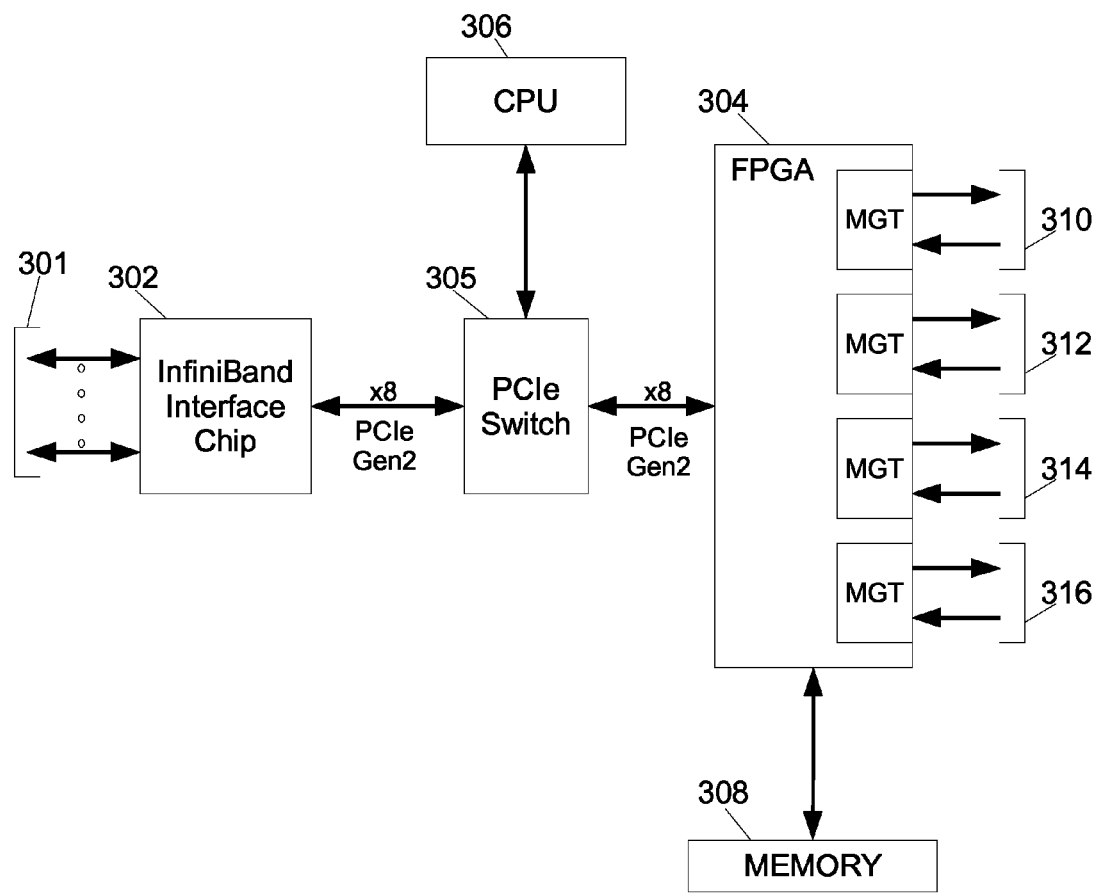
FIG. 3 illustrates an alternative exemplary embodiment of an I/O module that may be used in the high-speed storage system of this disclosure.

FIG. 3 illustrates an alternative I/O interface module 300 that is capable of receiving data-related requests through a plurality of high-speed InfiniBand ports (collectively referred to as 301).

Referring to FIG. 3, the exemplary alternative I/O module 300 includes an InfiniBand interface chip 302 that is capable of receiving and transmitting data-related requests and responses over a plurality of InfiniBand ports 301. The InfiniBand interface chip may be a standard InfiniBand chip, such as those available from Mellanox.

In general, the InfiniBand interface chip 302 receives data-related requests via the InfiniBand ports 301 and minimally decodes the received requests at least to the extent that it identifies the command header and, for external WRITE requests, the data payload. The interface chip 302 will then make the command header information available to a control CPU 306 though the use of a switching element, routing element or shared memory element 305, which—in the example of FIG. 3—is a PCI Express (PCIe) switch. Using the switching/routing/memory element 305, the interface chip 302 will also make the received data available to a high-speed controller 304 (which may be a configured FPGA). The high-speed controller 304 provides multiple serial system communication channels 310, 312, 314 and 316 to the crossbar modules and operates on the received data-related requests to provide and receive information and data to and from the crossbar modules in a manner similar to that described above in connection with high-speed controller 200 of FIG. 2.

It will be appreciated that the I/O interface modules 200 and 300 discussed above are exemplary only and that other types of I/O interface modules, including those using different physical layers, different communication protocols and discrete devices (as opposed to configured FPGAs) could be used without departing from the present disclosure.

In general, the main requirement of an I/O module is that it be able to receive and respond to externally provided data-related requests and that it be able to convey those requests (and receive information and data to respond to the requests) to multiple crossbar modules over a plurality of high-speed system communication channels.

The Crossbar Modules

As described above, the overall general functions of each crossbar module in the system of the present disclosure are to: (a) receive DMA requests from the I/O modules and provide those DMA requests (plus any associated data payloads) to the appropriate memory cards connected to the crossbar module and (b) receive retrieved data from the memory cards connected to the crossbar and to provide the retrieved data (and potentially some related information) to the I/O modules associated with the retrieved data.

Figure 4:
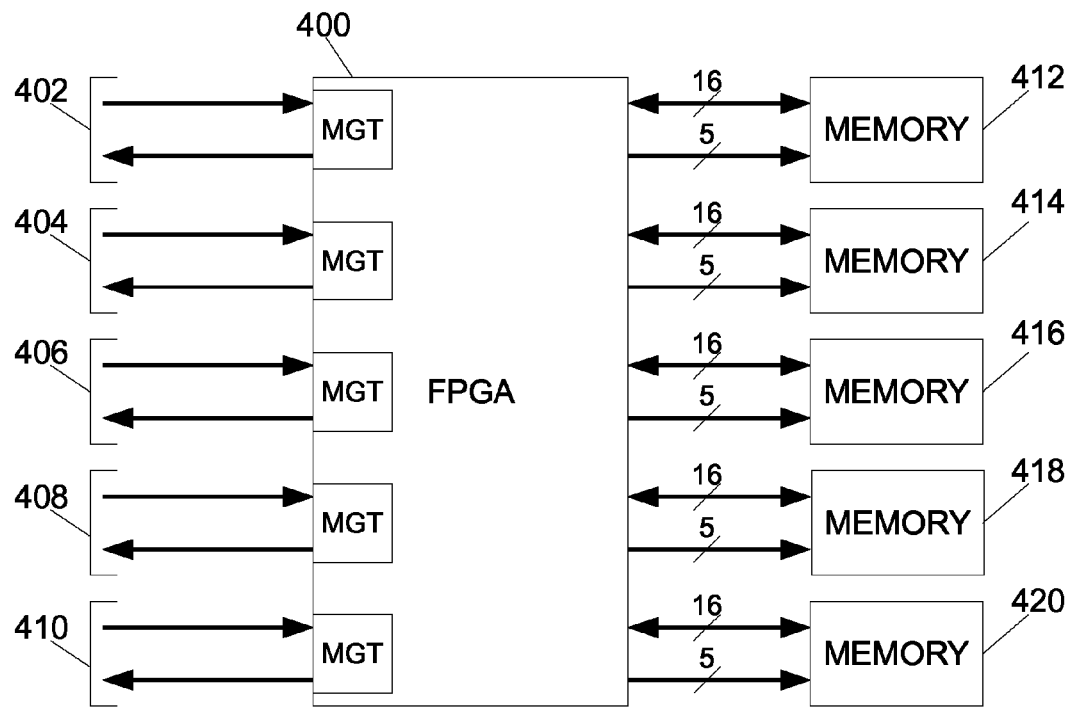
FIG. 4 illustrates one exemplary approach for implementing a crossbar module of the type described above in connection with FIG. 1.

Various approaches can be used to implement the crossbar modules of the disclosed systems. FIG. 4 illustrates one exemplary approach for implementing a crossbar module of the type described above in connection with FIG. 1.

Referring to FIG. 4, an exemplary crossbar module 400 is illustrated. While the crossbar module can be implemented through the use of discrete circuitry, application specific integrated circuits (ASICs), or a mix of the two, in the embodiment of FIG. 4, the crossbar module 400 is implemented through the use of a configured FPGA such as a Xilinx Virtex 4 FPGA.

In the example, the configured FPGA is configured to provide five serial systems communications ports 402, 404, 406, 408 and 410. Each serial communications port is configured and connected to provide high-speed, bi-directional communication channels between itself and one of the high-speed communication ports of an I/O module. Thus, in the example, because the crossbar module 400 provides five full-duplex communication ports, it can communicate simultaneously and independently with each of the I/O modules in the system 100. Thus, communication port 402 can be coupled to one of the serial communication ports of I/O interface module 102, port 404 to a port of I/O interface module 104, and so on, such that a serial connection exists between each of the I/O modules and the crossbar module 400.

In addition to providing the five serial communication ports described above, the crossbar module 400 of FIG. 4 also provides for multiple parallel communication buses used to enable communications between the crossbar module 400 and a plurality of memory cards. In the example of FIG. 4, there are five memory cards 412, 414, 416, 418 and 420, and the crossbar module 400 communicates with the memory cards using parallel buses. In the example of FIG. 4, communication between the crossbar module 400 and each of the individual memory cards is accomplished using a parallel bus that, in the example, includes a sixteen-bit (16) wide data bus and a five-bit (5) wide control bus for each memory card.

In general operation, the crossbar module 400 primarily serves as a means to receive DMA requests via one of the serial system links, identify specific memory cards to which the DMA requests should be directed, convert the received DMA requests from a serial format to a parallel format, and provide the parallel formatted DMA requests to the appropriate memory cards. In addition, the crossbar module 400 will typically receive data provided by a memory card, determine which I/O module the data is intended for, and transfer the received data to the appropriate I/O module over one of the serial system communication links as a DMA response.

In the exemplary case, the crossbar module 400 communicates with each I/O module using a serial interface bus, and with each memory card using a parallel interface bus. It should be noted that the implementation of the I/O interface bus depends on the I/O module, and the memory interface bus depends on the memory card. Either bus could, in theory, be implemented as either a serial or parallel interface, provided that the bus can perform at the required data rates. The interface buses are application-dependent, and the design decisions affecting the selection of a particular bus should be apparent to those skilled in the art. As an example, in order to minimize connector density, the memory card interface could be implemented as a high-speed serial connection similar in nature to the I/O module, simplifying the crossbar-to-memory interface.

Since each of the buses connecting a crossbar port to an I/O module is point-to-point, arbitration is minimal and regulated by a mechanism designed to allow the crossbar to hold off the I/O bus if necessary to prevent over-run.

The configuration of an FPGA to perform these tasks should be apparent to those of ordinary skill in the art having the benefit of this disclosure.

The Memory Cards

The memory cards that may be used in the disclosed system can take many forms. They can utilize a variety of memory including random access memory of different types (such as DDR RAM, DDR2 RAM, DDR3 RAM, and the like) and Flash memory of different types (including MLC Flash memory and SLC Flash memory, and the like). The structure of the memory cards can also vary depending, in part, on the type of memory that is used.

Figure 5:
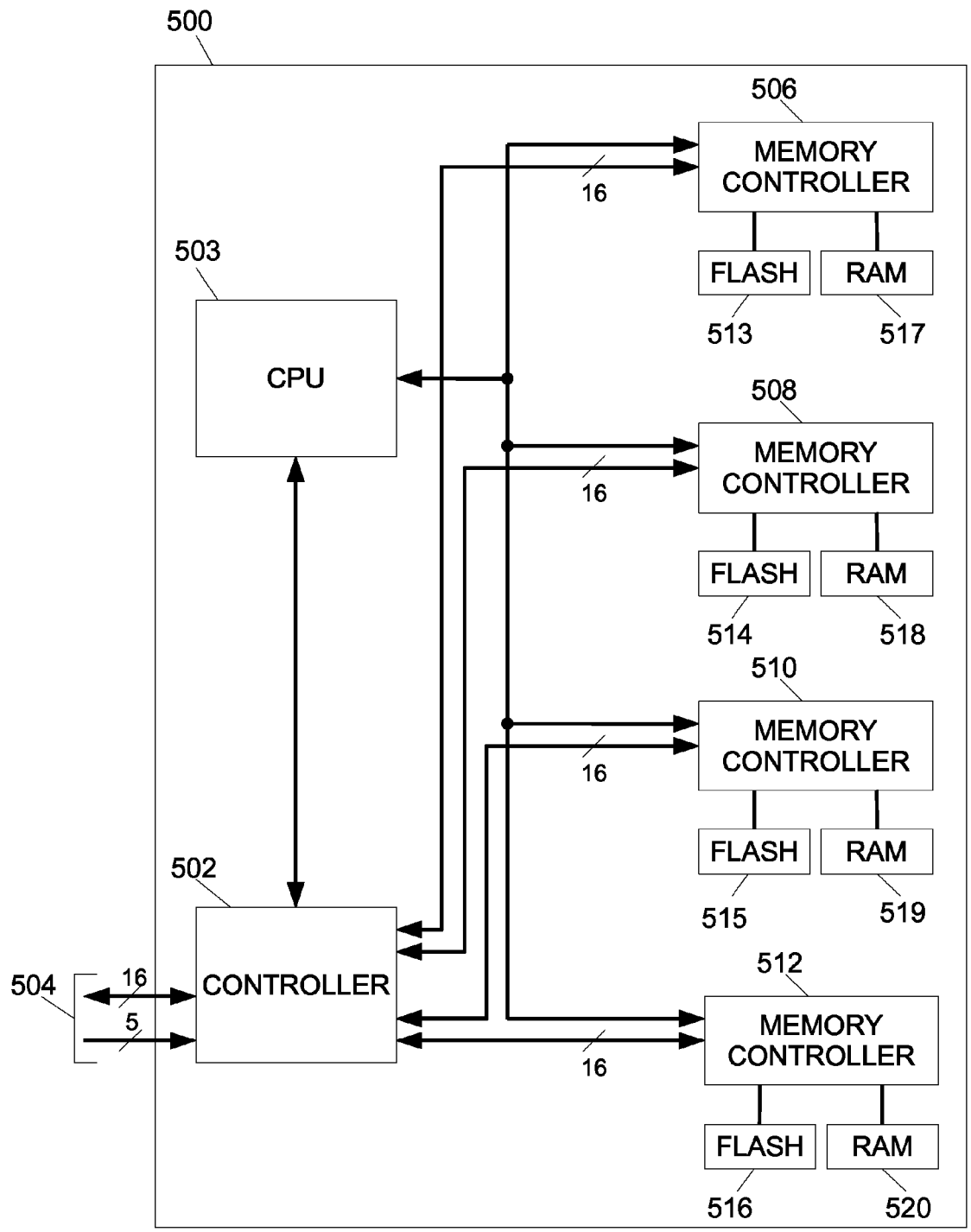
FIG. 5 illustrates an exemplary embodiment of a memory card that may be used in the system of the present disclosure.

FIG. 5 illustrates one exemplary embodiment of a memory card 500 that utilizes Flash memory and that may be used in the system of the present disclosure. In the example of FIG. 5, the Flash memory is SLC Flash memory, although embodiments in which MLC Flash memory is utilized are also envisioned.

Referring to FIG. 5, the Flash memory card 500 includes a system controller 502 that receives information over a parallel bus 504 coupling the system controller to one of the crossbar modules (not illustrated in FIG. 5). The parallel bus 504, as mentioned above, includes a sixteen-bit (16) wide data bus and a five-bit (5) wide control bus. The DMA requests provided by the crossbar module are received and processed by the system controller 502. The system controller 502 handles the communication protocols between the memory card and the crossbar module and may implement functionality such as error correction for the management of bus errors. In addition, the system controller 502 may also partially process the received TARGET ADDRESS to determine which of the specific memory elements on the memory card are associated with the TARGET ADDRESS.

In the exemplary system, the system controller 502 communicates with a number of individual Flash controllers 506, 508, 510 and 512 through direct connections. The system controller 502 also communicates with a CPU 503 that can also communicate with the individual Flash controllers. This communication may be through a direct connection to the Flash controllers, as shown in FIG. 5, or through a "pass-through" connection, wherein the CPU 503 communicates with the system controller 502 in order to access the Flash controllers. This is typically done to reduce bus fan-out, and is a design consideration that will be apparent to those skilled in the art.

In the illustrated example, communication between the system controller 502 and the Flash controllers 506, 508, 510 and 512 is accomplished using independent sixteen-bit (16) wide parallel buses, with one such independent parallel bus being coupled between the system controller 502 and each of the individual Flash controllers 506, 508, 510, and 512. Similar independent sixteen-bit (16) wide parallel buses may be used in embodiments where the CPU 503 communicates directly with each Flash controller 506, 508, 510 and 512.

Each of the individual Flash controllers is coupled to a physical Flash memory space 513, 514, 515, and 516, respectively, and to controller memory 517, 518, 519, and 520 (which may be DDR RAM memory, for example). In the illustrated example, each physical Flash memory space (513-516) is formed from ten independent Flash memory chips. In operation, the Flash controller 502 will process DMA requests to store provided data within a specified physical Flash memory and to retrieve the requested data and provide the same to the system controller 502. A number of different types of Flash controllers may be utilized. One preferred controller and its operation are described in more detail in co-pending U.S. patent application Ser. Nos. 12/554,888, 12/554,891, and 12/554,892, filed Sep. 5, 2009, which are hereby incorporated by reference.

Notably, because the system 100 of the present disclosure operates in such a manner that the TARGET ADDRESSES received by the I/O interface modules are the addresses provided to the memory cards, the present system can readily be used both with Flash memory (which ultimately requires a translation for the received TARGET ADDRESS to a physical Flash address location) and with RAM memory (or other memory that does not require a logical-to-physical address translation). Moreover, because any conversion from TARGET ADDRESS to physical Flash address occurs after the DMA request is provided to the memory cards, the present system enables the use of both Flash memory cards and RAM memory cards. This is because the operation of the Flash controllers in mapping a received TARGET ADDRESS to a specific physical Flash address is largely transparent to the interface bus coupling the crossbar modules to the memory cards.

Figure 6:
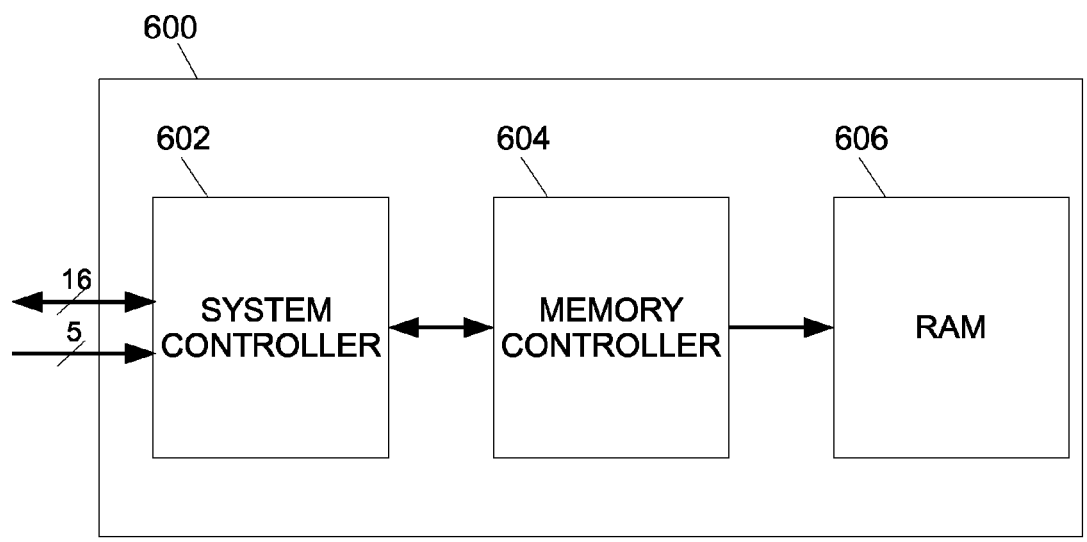
FIG. 6 illustrates an alternative embodiment of a memory card that may be used in the high-speed storage system of the present disclosure.

FIG. 6 illustrates an alternative embodiment of a memory card 600 that utilizes RAM memory and that may be used in the system of the present disclosure. In this embodiment, the address that is provided to the memory card by the crossbar module is used as a physical address for accessing RAM memory. Referring to the figure, the memory card 600 includes a number of elements that may all be positioned and affixed to a single multi-layer printed circuit board.

In general, the memory card 600 includes a system controller 602 that, like the controller 502 from FIG. 5, receives a DMA request from the crossbar module and processes the request using the protocol adopted for that system (which may include or be combined with error correction). The system controller then passes the request, and any data payload, to a memory controller 604 that can arrange for rapid DMA transfers of received data to the appropriate physical address corresponding to the TARGET ADDRESS (for a WRITE request) or retrieve data from the RAM memory 606 (which may be DDR, DDR2, DDR3 or any other high-speed RAM memory) using a DMA transfer and provide that data to the system controller 602 (for a READ request). It will be appreciated that the directionality of the arrows shown in FIG. 6 are only meant to depict an example of a WRITE operation. It will also be appreciated that for implementation purposes, both controller 602 and controller 604 can be combined into one FPGA device.

Alternative System Embodiment:

In the system 100 described above, crossbar modules are used to receive serially-transmitted data-related requests and to convert those requests into parallel-transmitted requests provided to memory cards. Alternative embodiments are envisioned wherein the crossbar modules are eliminated and the data-related requests are transmitted serially directly from the I/O modules to the memory cards.

Figure 7:
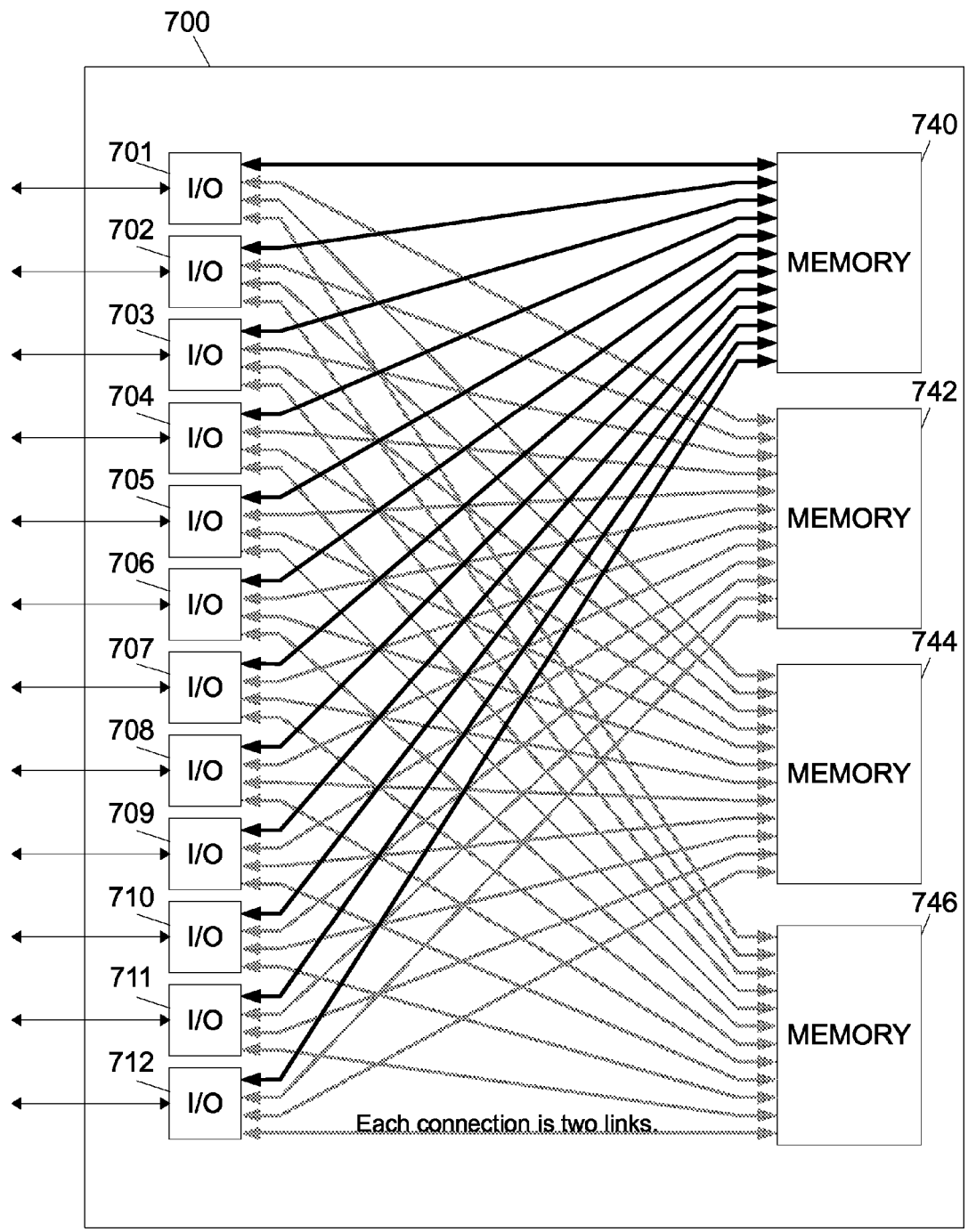
FIG. 7 illustrates an alternative high-speed storage system in which I/O modules communicate directly with memory boards without using crossbar modules.

FIG. 7 illustrates an alternative storage system 700 in which I/O modules or devices can communicate directly with memory boards using high-speed serial communication links without the use of crossbar modules.

Referring to FIG. 7, the alternative storage system 700 includes a plurality of I/O modules 701, 702, 703, 704, 705, 706, 707, 708, 709, 710, 711, and 712, each being coupled to one or more external hosts via one or more communication channels. In the illustrated example, each I/O module provides for a plurality of high-speed bi-directional full duplex serial communication channels that allow each of the I/O modules to communicate with each one of a plurality of memory boards 740, 742, 744 and 746. In the example of FIG. 7, each I/O module 701-712 provides eight serial communication ports, and each line connecting an I/O module and a memory board is intended to reflect two separate full duplex communication channels.

The I/O modules 701-712 are coupled to the memory boards 740, 742, 744 and 746 in such a manner that extremely high bandwidth communications are enabled. For example, the first I/O module 701 provides for eight serial data ports (two for each of the memory boards). Thus, the maximum data rate that the I/O module 701 can accommodate will be eight times the maximum bandwidth of the serial communication channels.

In operation, the I/O modules 701-712 operate similar to the I/O modules described above in connection with FIGS. 2 and 3. However, because the I/O modules of FIG. 7 provide for a greater number of serial communication channels, they enable the simultaneous and independent communication of more data-related requests or responses. This results in a higher bandwidth generally for the storage system 700 and specifically between the I/O modules 701-712 and the memory boards 740, 742, 744 and 746. For example, because the I/O module 701 provides for eight serial communication ports (two for each of the memory boards), it could simultaneously (or nearly simultaneously) and independently issue two WRITE requests to each of the memory boards 740, 742, 744 and 746, for a total of eight simultaneously (or nearly simultaneously) processed WRITE requests. Without the crossbars, the same arbitration and hold-off mechanism, as referred to in the original system 100, is located on each memory board in some embodiments.

In the example of FIG. 7, each serial system communications link is used to pass both data and control information to and from the I/O modules or the communicating devices and the memory boards. Among other things, each memory board will receive digital data and will respond to WRITE requests (to store digital data within specific locations in the physical memory space on the memory board) and will respond to READ requests (to retrieve and provide digital data stored within specific locations of the physical memory on the board). Because each high-speed serial communication link can receive or transmit serial data at a very high rate (625 MB/sec in the present example), the system of FIG. 7 can store and retrieve data at very high data rates.

Figure 8:
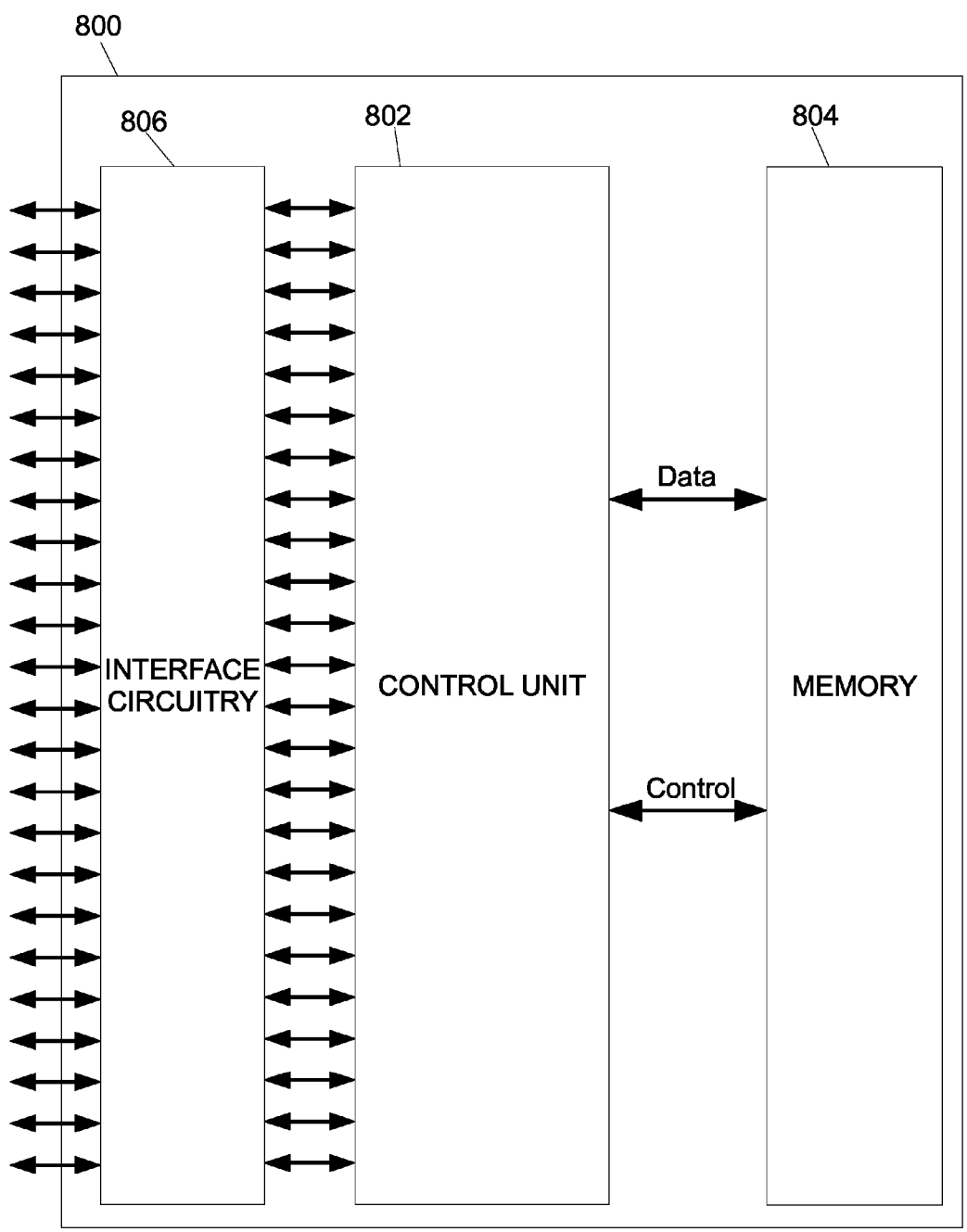
FIG. 8 illustrates an exemplary embodiment of a high-speed memory board that may be used in the high-speed storage system of FIG. 7.

FIG. 8 illustrates details concerning the structure of an exemplary memory board 800 for use in the system 700 of FIG. 7.

Turning to FIG. 8, the memory board 800 includes a storage control unit 802 and a physical memory space 804 formed from a plurality of individual memory chips. The memory board further includes appropriate interface circuitry 806 to allow the memory board to receive a plurality of serial communication links. In FIG. 8, the interface circuitry 806 allows the memory board 800 to receive inputs from twenty-four serial communication links. In the example of FIG. 8, the various components are all located on the same printed circuit board 800.

The storage control unit 802 can be formed through the use of a field programmable gate array, or "FPGA," such as a Virtex-6 FPGA (XC6VLX240T-2FFG1156CES) available from Xilinx operating at 333 MHz. It will be understood, however, that the storage control unit 802 could alternatively be implemented using other types of FPGA devices, discrete circuits, a programmed microprocessor, or a combination of any and all of the above.

In the illustrated example, the physical memory space 804 is constructed using a plurality of double data rate dynamic random access memory chips, DDR, such as DDR3-800 (MT4J128M8BY-25E) available from Micron Technologies, Inc. operating at 333 MHz. It will be understood, however that other forms of memory, such as alternative DDR devices, Flash and other types of memory may be utilized without departing from the teachings of this disclosure.

In the present example, the storage control unit 802 drives 288 external parallel data lines (better seen in FIG. 9) to the physical memory space 804. Because the memory space uses DDR memory clocked at 333 MHz, the high-speed memory board of FIG. 8 will be capable of storing up to 576 bits of digital information (512 bits of data and 64 bits of ECC) in the physical memory space for each clock cycle, thus providing an overall storage rate of approximately 24000 MB/sec for data and ECC or 20.83 GB/sec for data alone.

Figure 9:
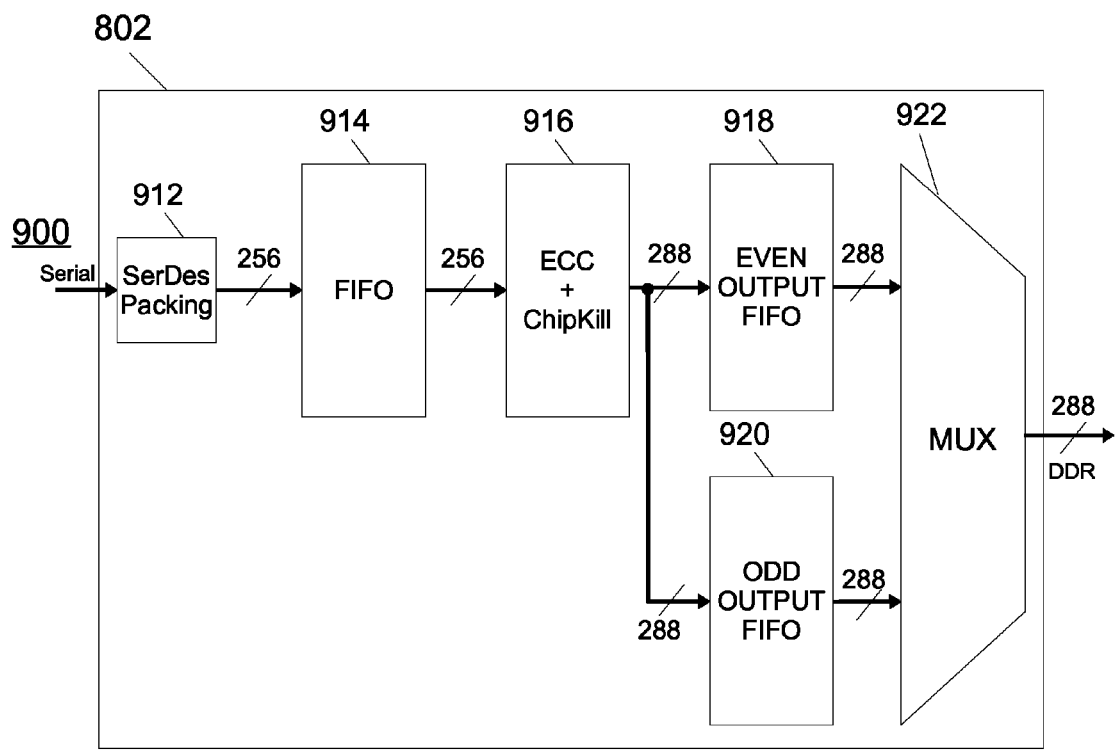
FIG. 9 illustrates portions of an exemplary high-speed memory board in greater detail.

FIG. 9 illustrates portions of the structure of an exemplary high-speed memory board in greater detail. In particular, FIG. 9 illustrates structures within the storage control unit 802 of FIG. 8 that may be used to receive digital data from a serial communication link and operate on such data for storage within the physical memory space 804.

Figure 10A:
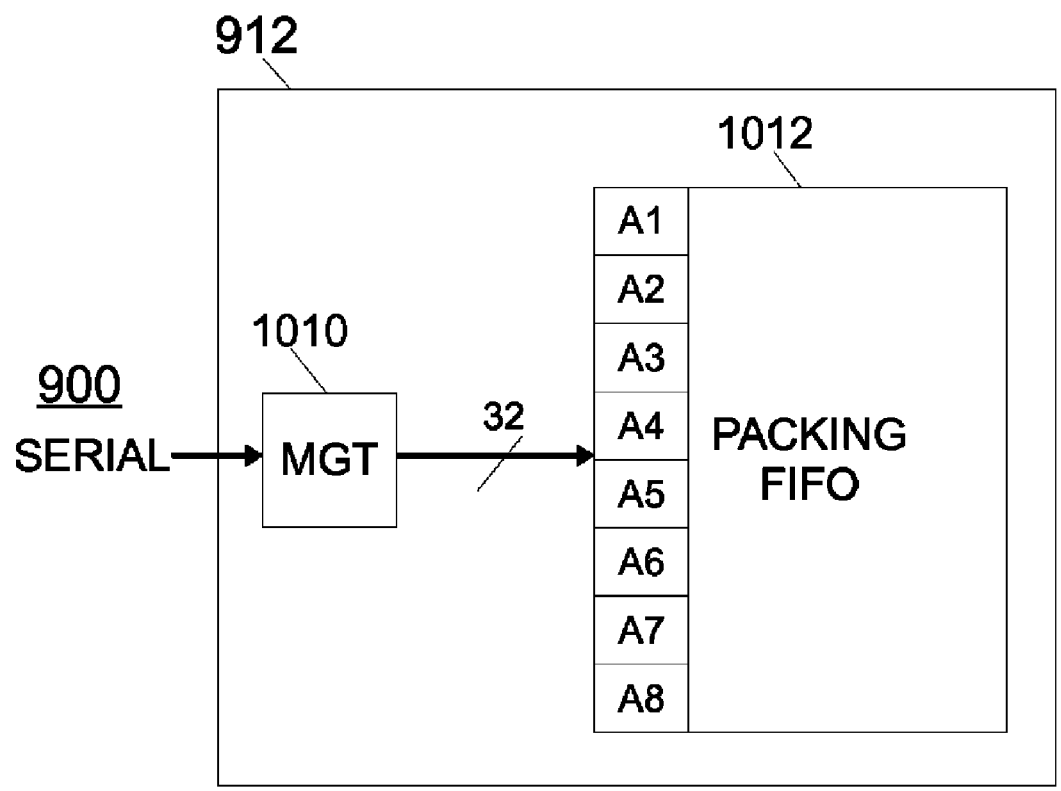
FIG. 10A illustrates an exemplary embodiment of a serializer/deserializer and packing module for a high-speed memory board.

Referring to FIG. 9, one of the high-speed serial communication links, serial link 900, is illustrated coupled to the storage control unit 802. The high-speed serial communication link 900 is provided to a serializer/deserializer and packing module 912 which will be located within the storage control circuit 802. This serializer/deserializer and packing module 912, further explained in FIG. 10A, depicts the serial link being input to a multi-gigabit transceiver (MGT) 1010, which will be located within the storage control unit 802. The MGT 1010 will receive serial data from the serial communication link and, on a periodic basis, convert the received serial data to parallel data. Moving ahead to the example of FIG. 10A, the MGT 1010 receives serial data and provides parallel 32-bit wide data at 156.25 MHz.

In the example of FIG. 10A, the 32-bit wide parallel data from the MGT 1010 is provided to a 256-bit wide, multiple word deep first-in-first-out (FIFO) storage buffer 1012 in such a manner that the received 32-bit wide data from the MGT 1010 is packed into 256-bit wide data words. This process is generally illustrated in FIGS. 10B-10D.

Figure 10B:
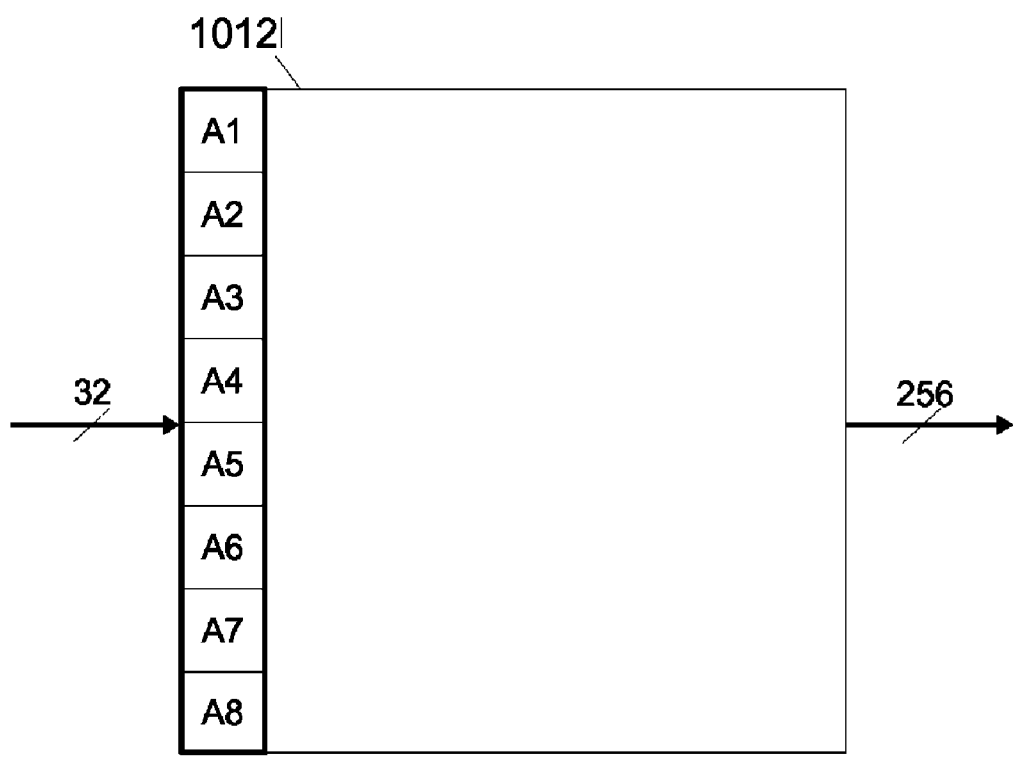
FIGS. 10B-10D illustrate an exemplary embodiment of a first-in-first-out (FIFO) storage buffer for a high-speed memory board.

Referring to FIG. 10B, the 256-bit wide FIFO storage 1012 is schematically illustrated as packed with a 256-bit wide word A1-A8. The method in which the illustrated system packs the 32-bit wide data from MGT 1010 to form 256-bit wide words is as follows. First, an initial 32-bit wide word, A1 in the example, will be received from MGT 1010. That initial 32-bit wide word A1 will be stored in an initial data location, as reflected in FIG. 10B. The next 32-bit wide word received from the MGT 1010, A2 in the example, will be stored in a second location, with the third word A3 stored in a third location, and so on until eight words A1-A8 have been received and stored in the FIFO 1012 to form the 256-bit wide word A1-A8, as reflected in FIG. 10B.

Figure 10C:
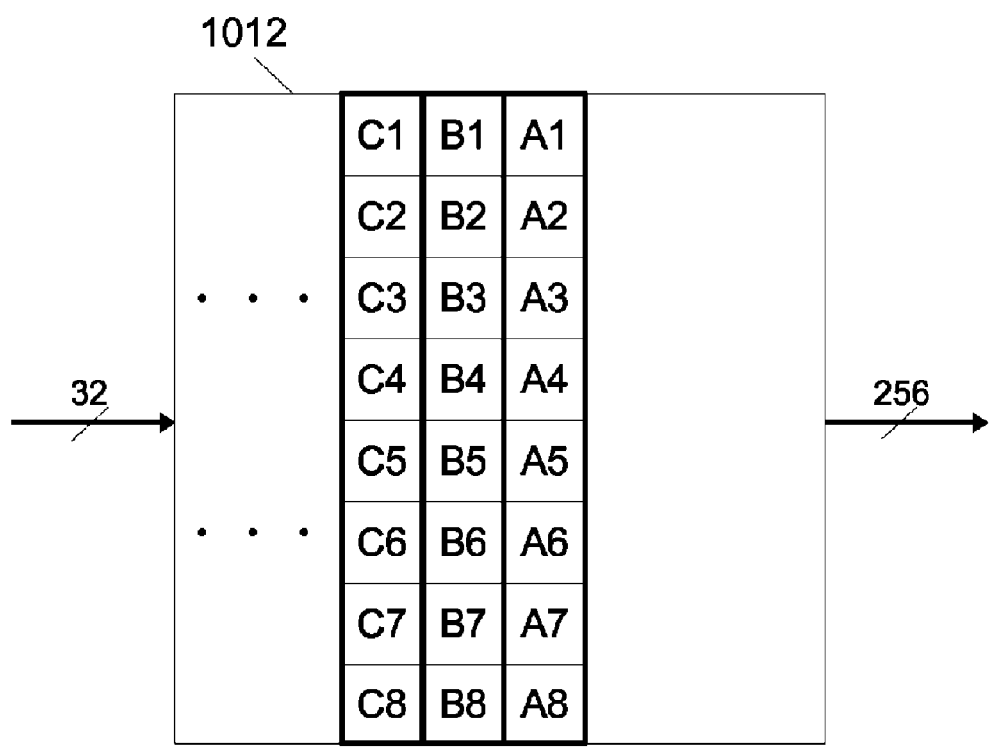
Figure 10D:
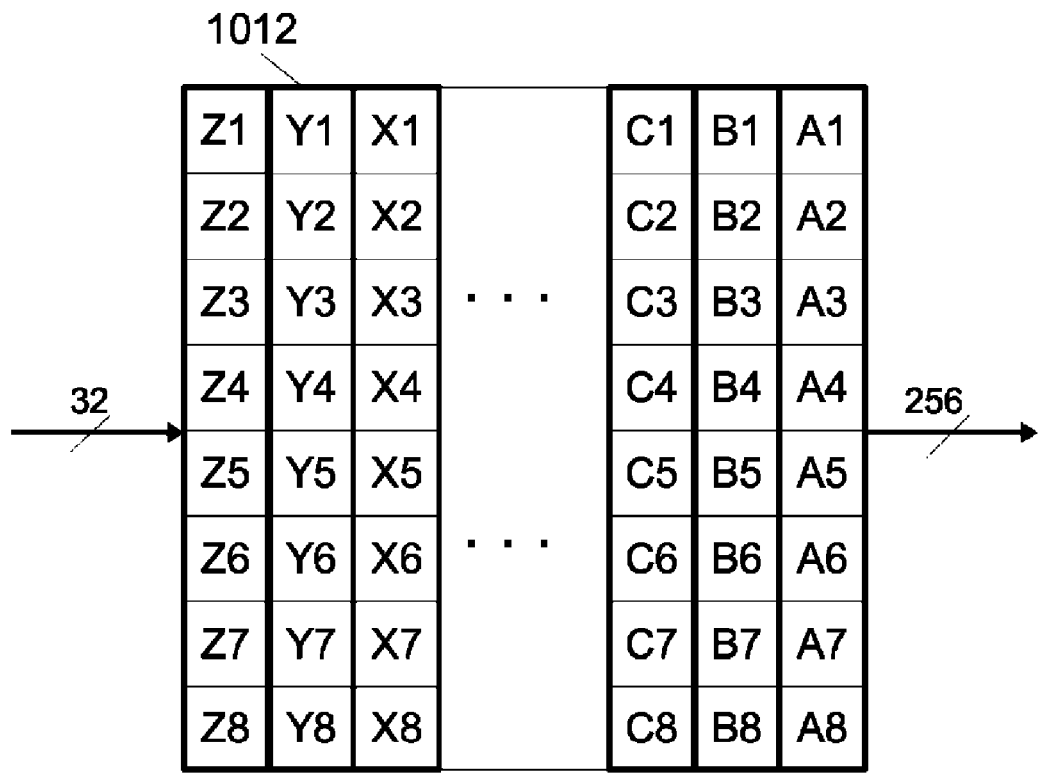

Once the 256-bit wide word A1-A8 has been formed through the process described above and another 32-bit wide word, B1 in the example, is received from the MGT 1010, the initial word A1-A8 will be shifted "down" to another location within the FIFO 1012 and the newly received 32-bit wide word will be stored in the initial location as reflected in FIG. 10C. This process will repeat until a second full 256-bit wide word B1-B8 is constructed as reflected in FIG. 10C. The process of receiving 32-bit words from the MGT 1010, packing the received 32-bit words into 256-bit words and shifting the 256-bit wide words through the FIFO 1012 will continue until the 256-bit wide memory locations within the FIFO 1012 are fully populated. An example of a more fully populated FIFO 1012 is illustrated in FIG. 10D.

While the "depth" of the stacking FIFO 1012 can vary from implementation to implementation, in the example of FIGS. 9 and 10A-10D, the FIFO 1012 is at least thirty-two 256-bit wide words deep. This is because, in the present example, a group of thirty-two 256-bit wide words is the basic unit used for data transfers to and from the physical memory space 804. As such, each group of thirty-two 256-bit wide words will be referred to herein as a basic memory cycle ("BMC") unit. In this example, each BMC unit will include 8,192 data bits (32×256) or 1 KB of data.

Referring back to FIG. 9, the data from the packing FIFO 912 is provided to a multi-channel FIFO buffer 914—only one channel of which is illustrated in FIG. 9. In the illustrated example, the multi-channel FIFO buffer 914 is 256 bits wide, can receive data at a rate of 256 bits/second, and is clocked at a rate of 27.7 MHz. Data is provided from the serializer/deserializer and packing module 912 to the multi-channel FIFO buffer 914 using a "burst" transfer where a complete BMC unit of data is transferred over thirty-two clock cycles.

Figure 11:
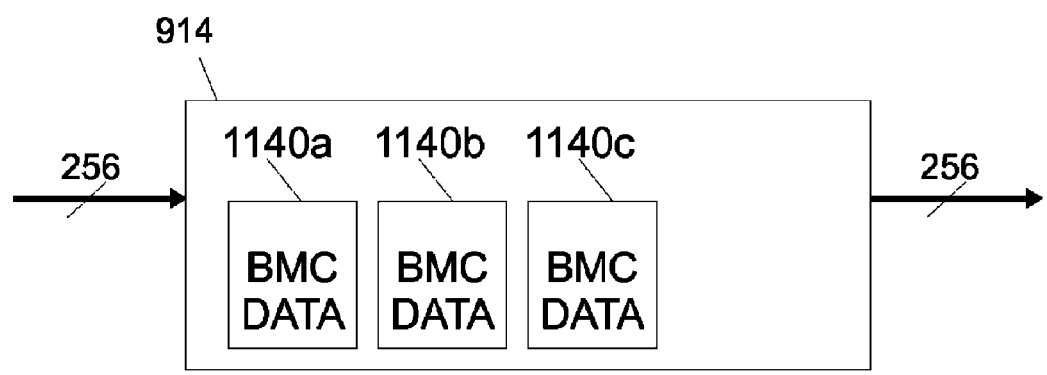
FIG. 11 illustrates an exemplary embodiment of a multi-channel FIFO buffer for a high-speed memory board.

Once a complete BMC unit of data is transferred from the serializer/deserializer and packing module 912 to the multi-channel FIFO buffer 914, the multi-channel FIFO buffer 914 will include a complete BMC unit of data in the form of 32 consecutive 256-bit "words." In the illustrated example, the depth of the multi-channel FIFO buffer 914 is such that it will be able to store multiple BMC units of data. This is generally reflected in FIG. 11, where the contents of a multi-channel FIFO buffer 914 are depicted as including three BMC units of data (represented by blocks 1140a, 1140b and 1140c).

Referring back to FIG. 9, the data stored in the multi-channel FIFO buffer 914 is provided to an error correction and data protection circuit 916 via a 256-bit wide parallel data bus operating at 333 MHz. The error correction and data protection circuit 916 processes the received data to introduce one or more error correction code bits ("ECC" bits) and to process the data for enhanced protection against data corruption. Examples of ECC processing are known to those of ordinary skill in the art, and any suitable ECC processing mechanism may be used. In addition, the error correction and data protection circuit may also implement other data protection techniques or transforms, such as "Chipkill" and other techniques commonly used for enhanced data protection. Chipkill, as understood by those having ordinary skill in the art, is a form of advanced ECC developed by IBM that protects computer memory systems from any single memory chip failure as well as multi-bit errors from any portion of a single memory chip. Additional information regarding Chipkill may be found in the following paper, which is incorporated herein by reference: Timothy J. Dell, A White Paper on the Benefits of Chipkill-Correct ECC for PC Server Main Memory, (1997), IBM Microelectronics Division.

As a result of the operations of error correction and data protection circuit 916, bits will be added to each 256-bit "word" provided to the circuit, and the resultant output of the circuit will be, in the example, 288 bits for each 256-bit input. This 288-bit output will correspond to the input data provided to the ECC and data protection circuit 916 and to the protection and ECC bits added by circuit 916.

The 288-bit wide outputs from the data protection circuit 916 are provided to two output FIFO buffers 918 and 920 via a 288-bit wide parallel bus. In the example, this parallel bus is clocked at 333 MHz. The data from the data protection circuit is provided to the output FIFO buffers 918 and 920 in a "ping-pong" manner such that the first 288-bit "word" from the circuit is provided to one of the output FIFO buffers (e.g., output FIFO buffer 918) while the next 288-bit "word" is provided to the other one of the output FIFO buffers (e.g., FIFO buffer 920) on the following clock cycle. In this manner, the data corresponding to a complete BMC unit is placed into the two output FIFO buffers 918 and 920 such that half of the data is in each output FIFO buffer. In the example, the depth of each output FIFO buffer 918 and 920 is such that each buffer can store data corresponding to multiple BMC units.

Figure 12:
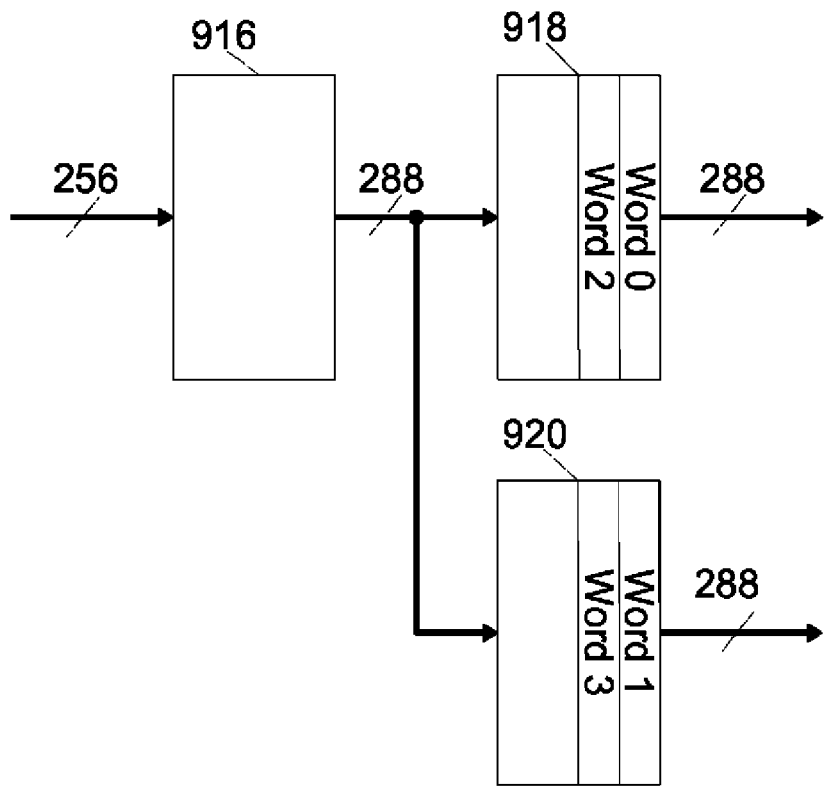
FIGS. 12 and 12A illustrate an exemplary process of moving data from an error correction and data protection circuit to output FIFO buffers of a high-speed memory board.
Figure 12A:
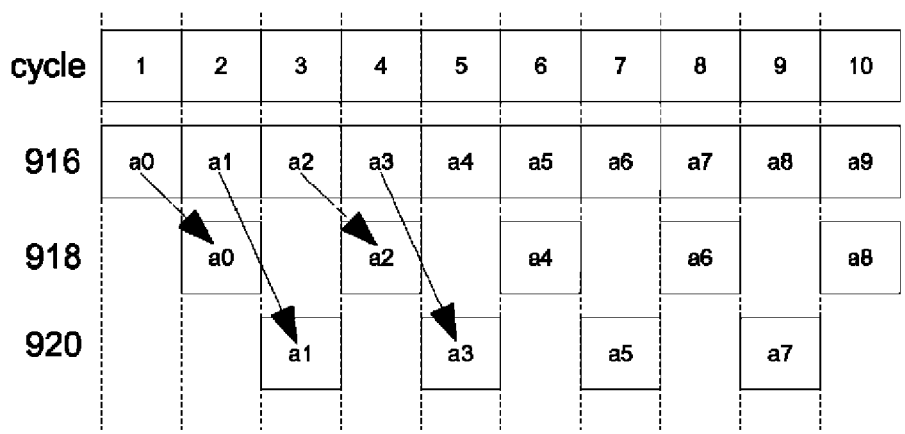

This process of moving data from the circuit 916 to the output FIFO buffers 918 and 920 is generally illustrated in FIGS. 12 and 12A, where exemplary contents of the output FIFO buffers 918 and 920 are illustrated after the transfer of a BMC unit. As reflected in the figures, the data of the exemplary BMC unit is contained in both buffers, and the data that makes up the complete BMC unit is "interleaved" across the two output FIFO buffers 918 and 920.

Referring back to FIG. 9, the data from the two output FIFO buffers 918 and 920 is provided to a high-speed, 576-bit wide output memory buffer 922. In the example of FIG. 9, each FIFO output buffer 918 and 920 provides 288 bits of data and error protection information to the high-speed output memory buffer 922 with each clock cycle and the input to the high-speed memory buffer 922 is, in the example, clocked at 333 MHz. At this speed and data transfer rate, a complete BMC unit of data (32 words) can be transferred in 16 clock cycles. Here, 16 words are stored in each of the FIFO output buffers 918 and 920, and thus 16 cycles are needed to transfer the entire BMC.

The coupling between the output FIFO buffers 918 and 920 and the high-speed output memory buffer 922 is such that the formerly "interleaved" data that was stored in the output FIFO buffers 918 and 920 is combined to form a single, properly ordered 576-bit "super-word" where the data is reflective of the order in which it was originally received across the high-speed serial communications link 900.

Referring back to FIG. 9, the data from the high-speed output buffer is provided to the physical memory 804 (not illustrated) over a 288 bit-wide parallel bus that is clocked at 333 MHz DDR. Because the DDR clock transfers data on both clock edges, the data from the output memory buffer 922 is effectively transferred at a rate of 667 MHz. As a result, the effective data transfer rate to memory of the circuit of FIG. 9 is 20.83 GB/sec.

For purposes of explanation, the example of FIG. 9 illustrates and describes the operation of the present system in connection with only a single high-speed serial input, serial input 701 in the example (see FIG. 7). In the full exemplary system, up to 24 individual high-speed serial communication links may be provided. The manner in which data from such a system having multiple serial communication links is processed by the present system is reflected in FIGS. 13A-13B.

Figure 13A:
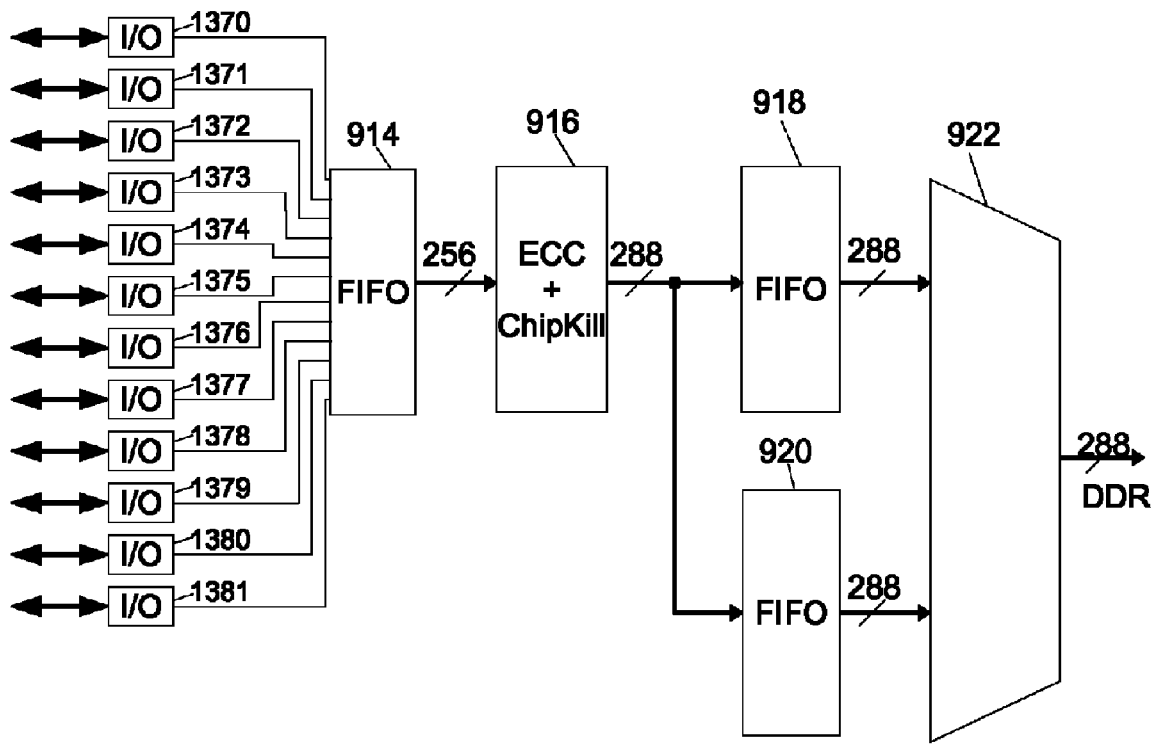
FIGS. 13A and 13B illustrate an exemplary process for moving data over multiple individual high-speed serial communication links.

Referring first to FIG. 13A, a system much like that discussed above in connection with FIG. 9 is illustrated. However, in the example of FIG. 13A, the input MGT 1010 and the packing FIFO buffer 1012 for the exemplary high-speed input have been combined to form an input processing block 1370. In addition, 11 other serial inputs 1371-1381 are shown, each having its own corresponding input processing block. Each of these input processing blocks operates like the circuitry described above in connection with FIGS. 9 and 10A-10D to be able to provide a complete BMC unit of data in a burst mode manner to the multi-channel FIFO buffer 914.

Because of the design of the system of FIG. 13A, the system can receive data at a very high rate such that, during peak operating conditions, data from a WRITE operation is almost always being provided to the multi-channel FIFO buffer 914 and data from multi-channel FIFO buffer 914 is almost always being provided to the error correction and data protection circuitry 916.

Figure 13B:
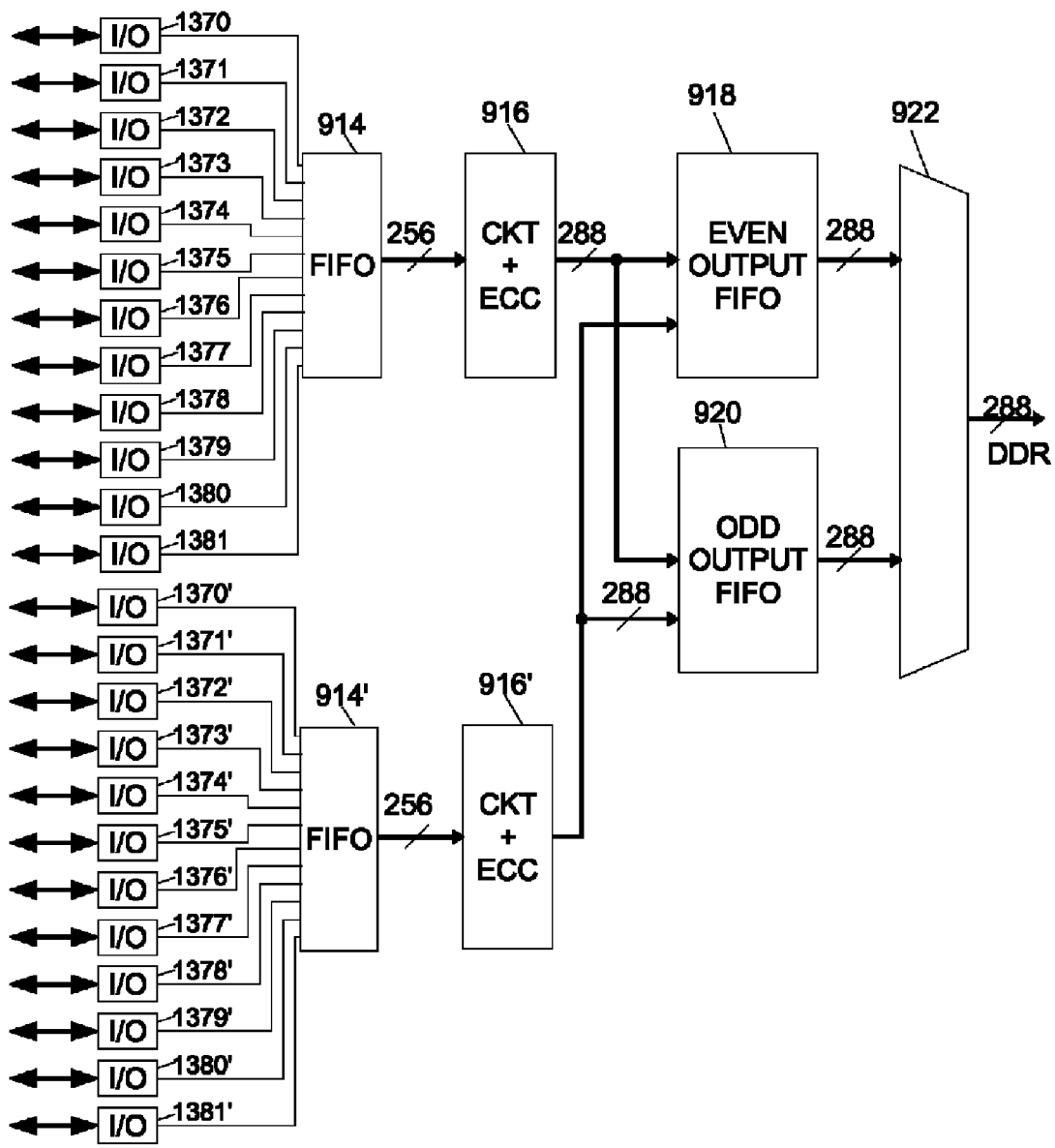

The system of FIG. 13A, however, preferably processes data from one-half of the high-speed serial communication links provided by the described system. As shown in FIG. 13B, the exemplary system includes another set of circuits, similar to those described above, including another multi-channel FIFO buffer 914' that processes data from the remaining 12 serial communication links and provides that data to a second error correction and data protection circuit 916'.

As reflected in FIG. 13B, the second error correction and data protection circuit 916' provides its output to the output FIFO buffers 918 and 920 in a "ping-pong" manner. However, in the exemplary system, the procedure for transferring data from the second error correction and data protection circuit 916' operates "out-of-phase" with the first error correction and data protection circuit 916 such that, while the first data protection circuit 916 is transferring data to one of the output FIFO buffers (e.g., the output FIFO buffer 918), the second error correction and data transfer circuit 916' will be transferring data to the other output FIFO buffer (e.g., output FIFO buffer 920). During the next clock cycle, the transfer will "switch." In this manner, data can, during each clock cycle, always be delivered to both output FIFO buffers 918 and 920.

To avoid improperly "intermingling" data from different WRITE operations, the data provided by the first and second error correction and data protection circuits 916 and 916' is preferably transferred to the output FIFO buffers 918 and 920 in such a manner that it can be recombined to look like data received across a single serial communication link. One approach for accomplishing this is reflected in FIGS. 14A and 14B.

Figures 14A, 14B:
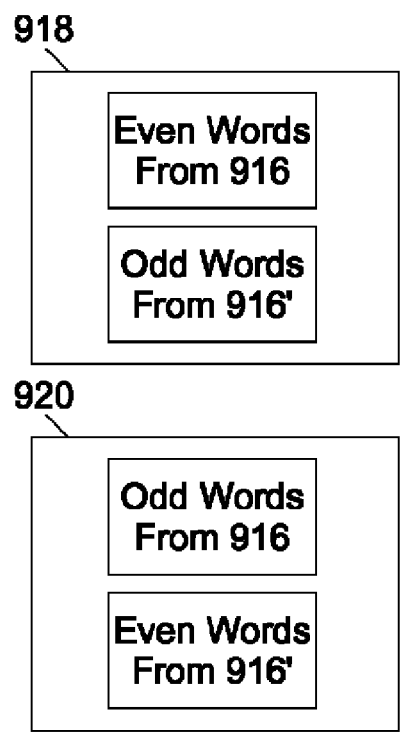
FIGS. 14A-14D illustrate exemplary processes for avoiding improperly "intermingling" data from different WRITE operations as the data is moved over the high-speed serial communication links.

Referring to FIGS. 14A and 14B, during a first data transfer operation, the first even word of the BMC unit ready to be transferred from the first error correction and data protection circuit 916 (e.g., Word0, a0) will be transferred by the first circuit 916 to a portion of the output FIFO buffer 918 reserved for the first circuit 916. At the same time, the first even word (Word0, b0) from the BMC unit ready to be transferred from the second error correction and data protection circuit 916' will be transferred to a portion of the output FIFO buffer 920 reserved for the storage of data from the second circuit 916'. During the next clock cycle, the first odd word (e.g., Word1, a1) from the BMC in the first circuit 916 will be stored in a reserved space of output FIFO buffer 920 and the first even word (e.g., Word1, b1) from the BMC in FIFO 916' will be stored in a reserved space in output FIFO buffer 918. In this method, data is always being transferred to both of the output FIFO buffers 918 and 920 such that maximum bandwidth is maintained.

Figures 14C, 14D:
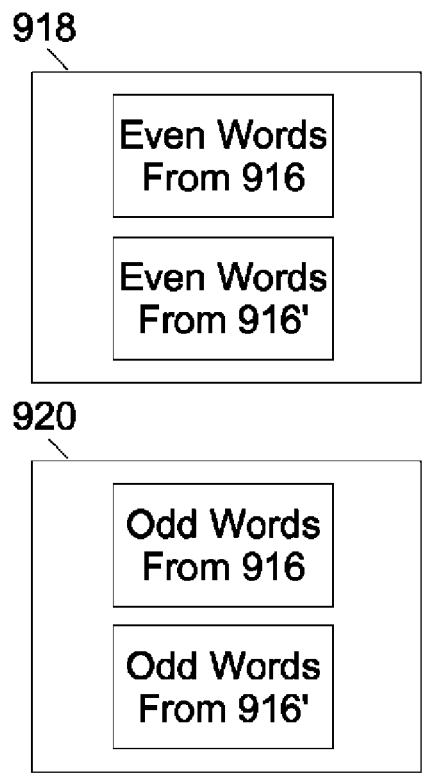

In an alternative method, the writing of data from the second error correction and data protection circuit 916' may be delayed by one cycle so that all even words are stored in output FIFO buffer 918 and all odd words are stored in output FIFO buffer 920 (see FIGS. 14C and 14D).

In addition to providing for the circuitry for receiving and processing data as reflected in FIG. 9 and the other figures discussed above, each memory card may also include similar structures (operating essentially in reverse) for retrieving data from the RAM memory at a high data rate and unpacking the received data such that it can be transferred across one of the high-speed serial communications channel to an I/O interface module, which may then provide the requested data to the appropriate host.

Figure 15:
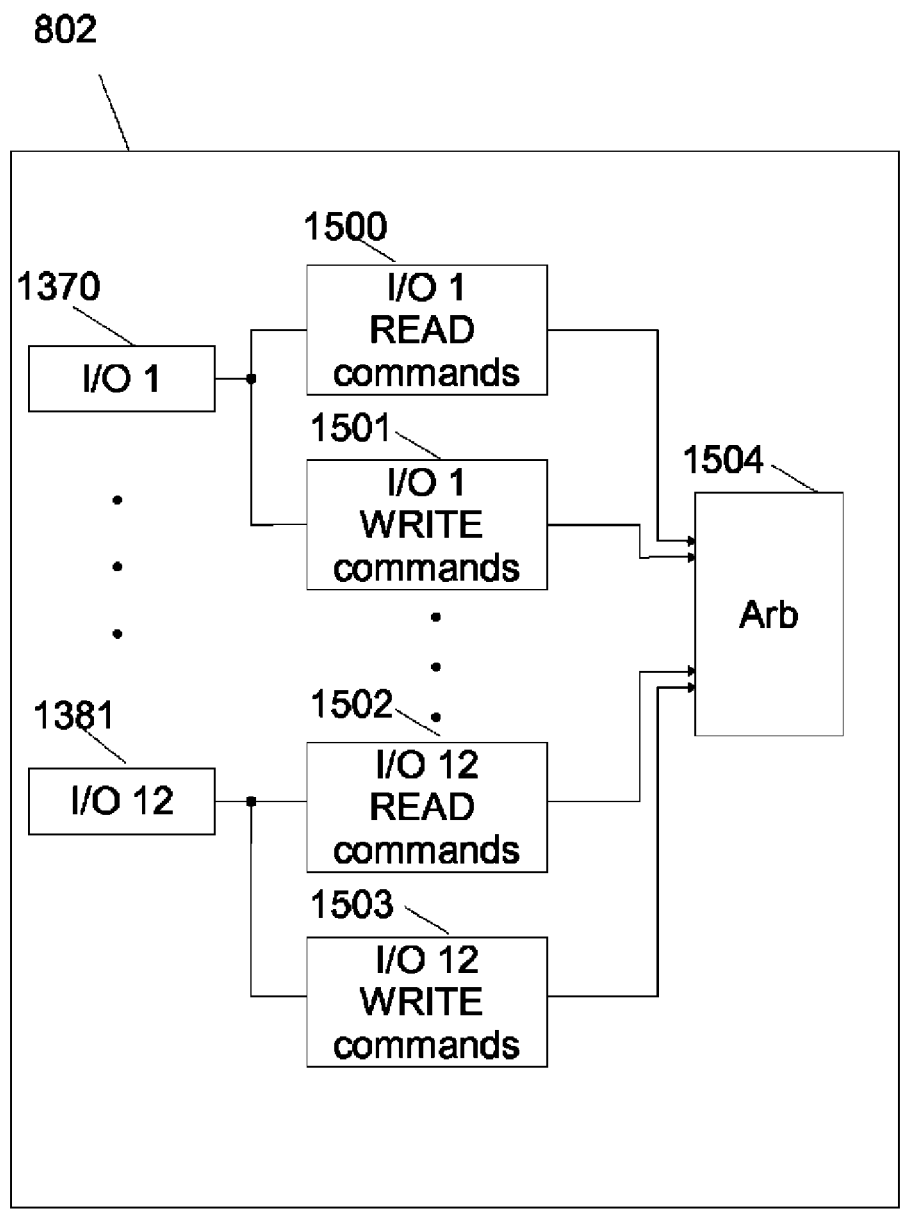
FIG. 15 illustrates an exemplary process for arbitrating between READ and WRITE access for data moved over the high-speed serial communication links in the high-speed storage system of this disclosure.

In the illustrated example, the data and address lines coupling the memory controller 802 to the physical RAM memory 804 are such that—at any given time—only a READ access or only a WRITE access can be accomplished. Thus, to provide optimum performance, the controller 802 must implement some form of arbitration, as shown generally in FIG. 15. In one embodiment, this arbitration is accomplished by including within the controller 802 an arbitration module 1504 that will receive the command header information for each data-related request and store the information in a buffer associated with the I/O interface module that provided the request. In a preferred embodiment, the arbitration module 1504 will maintain separate buffers 1500 and 1502 for READ operations and separate buffers 1501 and 1503 for WRITE operations, such that the controller 802 will maintain in buffered storage, on an I/O interface module by I/O interface module basis, a list of the READ and WRITE requests or commands received from each I/O interface module. In general, this list may be maintained on a time-stamped or time-ordered basis and each entry in the list may include the command information associated with each data-related request received from an I/O interface module, namely the TARGET ADDRESS, word count (or other indication of the amount of data to be transferred) and an indication of the transfer direction (e.g., whether it is a READ or WRITE operation).

To optimize performance, the READ and WRITE requests may be processed as follows:

In general, the arbitration module 1504 will give preference to READ requests and will, unless certain conditions discussed below are met, process the READ requests in the READ request buffers for the various I/O interface modules on a first-come, first-served basis.

If the arbitration module 1504 and the controller 802 have processed all of the READ requests such that no READ requests are outstanding, the arbitration module 1504 and the controller 802 will then process any outstanding WRITE requests in the WRITE request buffers on a first-come, first-served basis.

To avoid having too many WRITE requests outstanding, and to help address latency and coherency issues, the arbitration module 1504 and the controller 802 will process a WRITE request if it is determined that the number of outstanding WRITE requests has exceeded a certain threshold number. The arbitration module 1504 makes this threshold exceeding determination by considering: (i) the total overall number of outstanding WRITE requests from all of the I/O interface modules collectively; (ii) the total number of outstanding WRITE requests from a given I/O interface module; or (iii) some combination of the above. For example, if both the overall number of outstanding WRITE requests and the number of WRITE requests for a given I/O interface module were considered, the arbitration module 1504 could have the controller 802 process a WRITE request if either: (i) the overall number of outstanding WRITE requests exceeded a first threshold (in which case an outstanding WRITE request could be handled based on a first-come, first-served basis) or (ii) the number of outstanding WRITE requests for a given I/O interface module exceeded a second threshold (which may be lower than the first threshold), in which case the arbitration module 1504 would have the controller 802 handle a WRITE request from the specific I/O interface module associated with the over-threshold buffer on a first-come, first-served basis.

Furthermore the arbitrator can process a WRITE request if it is determined that the stored data within one of the output FIFO buffers associated with the reception of data has exceeded a certain limit, such as an amount over ½ of the storage capacity of the output FIFO buffer, in which case a WRITE request associated with that output FIFO buffer would be processed so that the I/O interface modules can continue to send data and data-related requests without interruption or throttling.

In addition to the above, the arbitration module 1504 may also control how READ And WRITE requests are processed so that data coherency is maintained. For example, if it is determined that an outstanding READ request is directed to a specific address and that there is an earlier-in-time outstanding WRITE request, the arbitration module 1504 can have the controller 802 process the outstanding WRITE request to ensure that the appropriate data is returned in response to the READ request.

Memory Chip Access

There are various approaches and methods that the memory controller 802 can use to transfer data to and from the physical RAM memory. In one embodiment, the controller 802 can operate as, or include, a DDR3 memory control module that receives the command information from the arbitration module 1504 along with a start indicator to control the timing of the data transfer. In general, the command information provided by the arbitration module 1504 may include: the same information stored in the buffers that are used for purposes of arbitration, namely, the TARGET ADDRESS, and more specifically, the starting address for the transfer; an identifier of the amount of data to be transferred, which may be a word count; and the transfer direction. The controller 802, acting as a memory control module, will then activate the appropriate memory chips as indicated by the TARGET ADDRESS (starting address).

If the transfer direction indicates a WRITE to memory, the controller 802 will coordinate issuing commands to the memory chips (e.g., timing and address commands) while transferring data from the output memory buffer 922.

If the transfer direction indicates a READ from the RAM memory, the controller 802 will coordinate issuing the appropriate address and timing commands to the memory chips while transferring data from the memory chips to a output FIFO buffer is associated with the I/O interface module to which the data is directed.

In one example, the controller 802 will receive the next set of command information before the data transfer associated with the previous command is completed, thus allowing the system to operate at maximum bandwidth.

Figure 16:
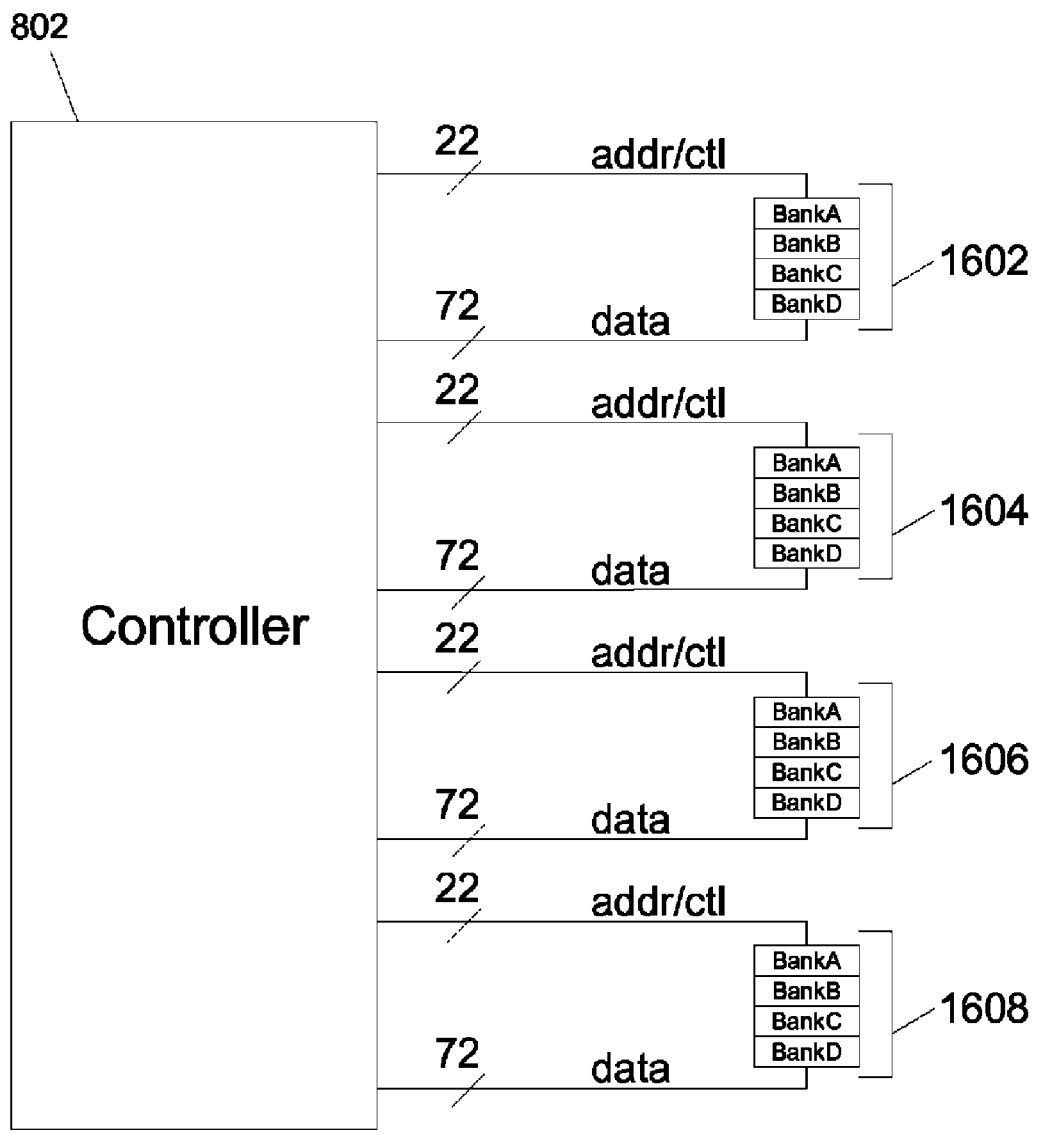
FIG. 16 illustrates an exemplary controller and the connections between the controller and physical RAM memory in the high-speed storage system of this disclosure.
Figure 17:
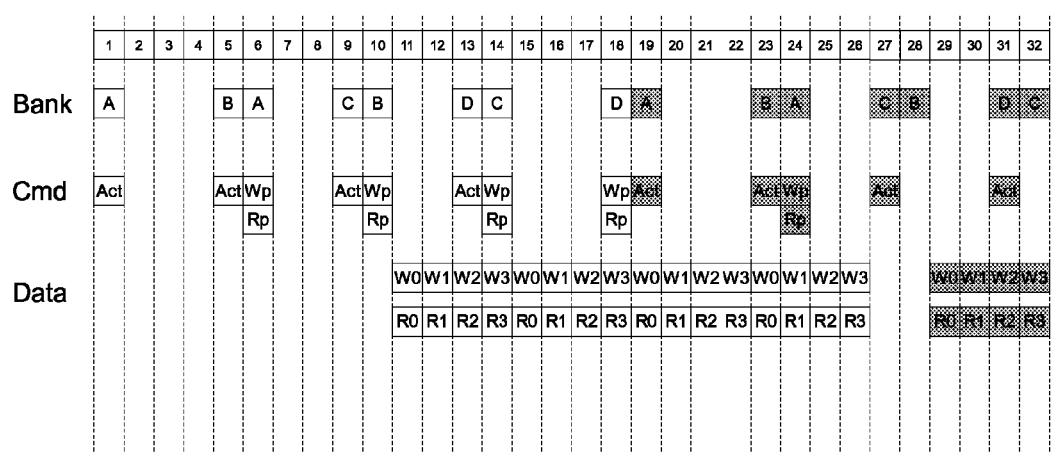

The general operation of the controller 802 as it controls the transfer of data to and from the physical RAM memory is generally reflected in FIGS. 16 and 17.

Referring first to FIG. 16, one specific arrangement of the physical RAM memory is shown. In the embodiment of FIG. 16, a controller 802 is illustrated and the connections between the controller 802 and the physical RAM memory are shown. In this example, the physical RAM memory coupled to the controller 802 takes the form of seventy-two (72) memory chips divided into four sections (1602, 1604, 1606, and 1608), each section having 18 memory chips. In this example, each memory chip has four banks (A, B, C, D). Memory chips are coupled together such that they share: (a) address and control lines (22 in the example), and (b) data lines (72 in the example). The coupling shown in FIG. 16 is only one method of connecting the physical memory chips to controller 802. All four sections, despite having separate control buses, operate in unison and are issued commands at the same time and for the same bank.

Additional details concerning the operation of the memory controller 802 may be found in FIG. 17. FIG. 17 illustrates the operation of the controller 802 over two basic memory cycles (with the second basic memory cycle shown here as incomplete). In general, each memory cycle involves the transfer of 32 288-bit words to (or from) the DDR memory. In the specific example, the transfer occurs over 16 actual clock cycles. At 333 MHz, this provides for a transfer rate of 1 KByte of data each 48 ns, or 20.83 GBytes/second (data alone), for each memory card. Considering that a system, as reflected in FIG. 7, may have a number of memory cards, the overall bandwidth of the system can be significantly higher than 20.83 GBytes/second and, if five or more memory cards are used, can exceed 100 GBytes/second.

Referring to FIG. 17, a basic memory cycle is initiated by activating Bank A of the memory through the command buses associated with each section. This occurs in the example of FIG. 17 at clock cycle 1. Four clock cycles later, at clock cycle 5, an activation command is provided for Bank B. Four cycles thereafter, at clock cycle 9, Bank C is activated, and four cycles after that, at clock cycle 13, Bank D is activated. This approach, of selectively activating the various banks, allows for any physical precharge times not to be violated, since Bank A will be precharged between cycles 6 and 19, when the subsequent activate command for Bank A is issued.

For each of the various banks, five cycles after the bank is rendered active, the command indicating whether the data transfer is a READ or a WRITE will be asserted for that specific bank. Thus, this occurs at clock cycle 6 for Bank A, clock cycle 10 for Bank B, clock cycle 14 for Bank C, and clock cycle 18 for Bank D.

Five clock cycles after the provision of the indication of whether the transfer is a READ or a WRITE, the data will be provided to the data lines for four consecutive cycles. Because the data is being transferred at a double data rate (DDR) two words will be transferred for each memory clock cycle. Thus eight 288-bit words of data will be transferred for each bank over the entirety of the basic memory cycle (the notation for the data bus in FIG. 17, W0, encompasses two 288-bit words).

During the course of the data transfer for the basic memory cycle under discussion, the basic memory cycle for the next memory cycle will be initiated through the assertion of the activation command for Bank A at clock cycle 19. The remainder of the subsequent basic memory cycle follows that previously described above with respect to the first basic memory cycle.

As the above indicates, a complete 1 Kbyte of data will be transferred each basic memory cycle. In one embodiment, the system can provide for "half-write" cycles where only 512 bytes are transferred. For such "half-write" cycles, the activations for only two consecutive banks will be asserted (e.g., Banks A & B or Banks C & D). The other banks will remain idle during the cycle. The TARGET ADDRESS for the transfer will determine which two of the four banks are active for the transfer.

The above embodiments are illustrative and not limiting. Other and further embodiments utilizing one or more aspects of the inventions described above can be devised without departing from the spirit of the disclosed embodiments. Further, the order of steps described herein can occur in a variety of sequences unless otherwise specifically limited. The various steps described herein can be combined with other steps, interlineated with the stated steps, and/or split into multiple steps. Similarly, elements have been described functionally and can be embodied as separate components or can be combined into components having multiple functions.

The disclosed embodiments have been described in the context of preferred and other embodiments and not every embodiment of the invention has been described. Obvious modifications and alterations to the described embodiments are available to those of ordinary skill in the art. The disclosed and undisclosed embodiments are not intended to limit or restrict the scope or applicability of the invention conceived of by the Applicants. Applicants intend to fully protect all such modifications and improvements that come within the scope or range of equivalent of the following claims.

What is claimed is:

1. A Flash-based memory module having high-speed serial communication, comprising:
    a plurality of input/output (I/O) modules, each I/O module configured to communicate with an external device over one or more external communication links;
    a plurality of Flash-based memory cards, each Flash-based memory card comprising a plurality of Flash memory devices, each Flash memory device having a physical memory space that is divided into blocks, each block being further divided into pages, each page representing an individually addressable memory location on which memory operations are performed, multiple such memory locations being erasable at the same time in one-block groupings; and
    a plurality of crossbar switching elements, each crossbar switching element being connected to a respective one of the Flash-based memory cards and configured to allow each one of the I/O modules to communicate with the respective one of the Flash-based memory cards;
    wherein each I/O module is connected to each crossbar switching element by a high-speed serial communication link, each high-speed serial communication link allowing each I/O module to transmit and receive bits representing commands, instructions and/or data to and from each crossbar switching element; and wherein each crossbar switching element is connected to the respective one of the Flash-based memory cards by a plurality of parallel communication links, each parallel communication link connecting one crossbar switching element to one of the Flash memory devices of the respective one of the Flash-based memory cards.

2. The Flash-based memory module of claim 1, wherein the bits representing commands, instructions and/or data transmitted by the I/O modules are part of a direct memory access (DMA) request, such a DMA request including a read-modify-write DMA request.

3. The Flash-based memory module of claim 1, wherein the I/O modules are configured to communicate with the external device over the one or more external communication links using a high-speed communication protocol, including one of the following protocols: Fibre Channel, InfiniBand, Ethernet, and Front Panel Data Port.

4. The Flash-based memory module of claim 3, wherein each I/O module comprises a high-speed interface configured to allow the I/O module to communicate with the external device over the one or more external communication links using the high-speed communication protocol.

5. The Flash-based memory module of claim 4, wherein each I/O module further comprises a high-speed controller having multiple multi-gigabit transceivers, one multi-gigabit transceiver for each high-speed serial communication link connected to the I/O module, each I/O module being configured to transmit and receive the bits representing commands, instructions and/or data to and from each crossbar switching element using the multi-gigabit transceivers.

6. The Flash-based memory module of claim 5, wherein each I/O module further comprises a CPU and a shared switching element, the shared switching element configured to regulate communication among the CPU, the external device via the one or more external communication links, and the multi-gigabit transceivers.

7. The Flash-based memory module of claim 1, wherein each crossbar switching element comprises a high-speed controller having multiple multi-gigabit transceivers, one multi-gigabit transceiver for each high-speed serial communication link connected to the crossbar switching element, each crossbar switching element being configured to transmit and receive the bits representing commands, instructions and/or data to and from each I/O module using the multi-gigabit transceivers.

* * * * *